(12) United States Patent
Zheng

(10) Patent No.: US 6,927,170 B2
(45) Date of Patent: Aug. 9, 2005

(54) METHODS FOR MAKING SEMICONDUCTOR DEVICE STRUCTURES WITH CAPACITOR CONTAINERS AND CONTACT APERTURES HAVING INCREASED ASPECT RATIOS

(75) Inventor: Lingyi A. Zheng, Boise, ID (US)

(73) Assignee: Micron Technology, Inc., Boise, UT (US)

(*) Notice: Subject to any disclaimer, the term of this patent is extended or adjusted under 35 U.S.C. 154(b) by 0 days.

(21) Appl. No.: 10/916,888

(22) Filed: Aug. 11, 2004

(65) Prior Publication Data

US 2005/0009330 A1 Jan. 13, 2005

Related U.S. Application Data

(63) Continuation of application No. 10/329,913, filed on Dec. 26, 2002, now Pat. No. 6,812,150.

(51) Int. Cl.[7] .............................................. H01L 21/302
(52) U.S. Cl. ....................... 438/702; 438/253; 438/396; 438/637; 438/778
(58) Field of Search ................................ 438/239, 243, 438/253, 396, 618, 637, 702, 778, 975, FOR 220, FOR 355, FOR 388, FOR 395, FOR 430

(56) References Cited

U.S. PATENT DOCUMENTS

| | | | |
|---|---|---|---|
| 5,459,345 A | 10/1995 | Okudaira et al. | |
| 6,037,220 A | 3/2000 | Chien et al. | |
| 6,043,526 A | 3/2000 | Ochiai | |
| 6,100,136 A | 8/2000 | Lin et al. | |
| 6,117,791 A | 9/2000 | Ko et al. | |
| 6,136,661 A | 10/2000 | Yen et al. | |
| 6,153,899 A | 11/2000 | Ping | |
| 6,204,143 B1 | 3/2001 | Roberts et al. | |
| 6,277,688 B1 | 8/2001 | Tseng | |
| 6,319,787 B1 | 11/2001 | Enders et al. | |
| 6,461,911 B2 | 10/2002 | Ahn et al. | |
| 6,472,266 B1 | 10/2002 | Yu et al. | |
| 2001/0002710 A1 | 6/2001 | Roberts et al. | |
| 2002/0013055 A1 | 1/2002 | Yamaguchi et al. | |
| 2002/0039809 A1 | 4/2002 | Howard | |
| 2002/0192905 A1 | 12/2002 | Sekiguchi et al. | |
| 2003/0077893 A1 | 4/2003 | Demolliens et al. | |

*Primary Examiner*—George Fourson
*Assistant Examiner*—Joannie Adelle Garcia
(74) *Attorney, Agent, or Firm*—TraskBritt

(57) ABSTRACT

Semiconductor device structures and methods of making such structures that include one or more etched openings (e.g., capacitor containers and/or contact apertures) therein with increased height-to-width ratios are provided. The structures of the present invention are formed by successive layer deposition wherein conventional patterning techniques may be utilized in a stepwise fashion as the height of the structure is increased. Further provided is a self-aligning interconnection structure which may be used to substantially vertically align openings formed in successively deposited, vertically placed structural layers of a semiconductor device. The interconnection structure utilizes a cap-and-funnel model that self-aligns to the center plane of an opening in a first structural layer and also substantially prevents subsequently deposited material from entering the opening.

19 Claims, 19 Drawing Sheets

METHODS FOR MAKING SEMICONDUCTOR DEVICE STRUCTURES WITH CAPACITOR CONTAINERS AND CONTACT APERTURES HAVING INCREASED ASPECT RATIOS

CROSS-REFERENCE TO RELATED APPLICATION

This application is a continuation of application Ser. No. 10/329,913, filed Dec. 26, 2002, now U.S. Pat. No. 6,812,150, issued Nov. 2, 2004.

BACKGROUND OF THE INVENTION

1. Field of the Invention

The present invention relates generally to the fabrication of semiconductor device structures. More particularly, the present invention relates to semiconductor device structures with capacitor containers, contact apertures, or other openings therein that have increased height-to-width ratios. Further, the present invention relates to methods of making semiconductor device structures having capacitor containers, contact apertures, or other openings therein with increased aspect ratios.

2. Background of the Related Art

In computer semiconductor devices, such as dynamic random access memory (DRAM) semiconductor device modules, the memory capacitors typically are formed inside containers, such as phosphosilicate glass (PSG), borosilicate glass (BSG), or borophosphosilicate glass (BPSG) containers, through etching techniques. An exemplary partially fabricated semiconductor device structure 10 is schematically illustrated in FIG. 1. A conductive plug 11 located between neighboring conductive structures 12, such as transistor gate stacks, forms electrical contact with an active device region 14 of a semiconductor substrate 16, e.g., a silicon (Si) wafer. A planarized insulating layer 18, such as a BPSG layer, surrounds the conductive structures 12. The conductive plug 11 is formed within an opening through the insulating layer 18. A structural layer 20 having a height, H, overlies the insulating layer 18 and may also be formed of BPSG or similar material. A capacitor container 22 having a width W is formed in the structural layer 20, generally by etching the structural layer 20 through a photomask (not shown). The capacitor container 22 is a generally cylindrical cavity formed contiguous with the conductive plug 11 (or an active device region 14 of the semiconductor substrate 16) and includes sidewalls 24 that extend to an opening in the insulating layer 18.

Typically, etching techniques include the depositing, masking and patterning of protective layers, such as photoresists (not shown), which act as templates and may be patterned to form photomasks (not shown) through which structures in the desired layer (e.g., structural layer 20) of a semiconductor device structure may be defined. Wet etch or dry etch techniques may be employed to define semiconductor device structures. In contrast with wet etch techniques, techniques involving dry etch, including, without limitation, glow-discharge sputtering, ion milling, reactive ion etching (RIE), reactive ion beam etching (RIBE), plasma etching, point plasma etching, magnetic ion etching, magnetically enhanced reactive ion etching, plasma enhanced reactive ion etching, electron cyclotron resonance and high-density plasma etching, are capable of etching in a substantially anisotropic fashion. This means that the target area of a substrate is etched primarily in a substantially vertical direction relative to the exposed, or active, surface of the substrate. Thus, such dry etch techniques are capable of defining structures with substantially vertical sidewalls. Consequently, such dry etch techniques are capable of accurately reproducing the features of a photomask. Due to a trend in semiconductor fabrication processes toward decreased dimensions of structures on semiconductor devices, dry etching is often desirable for defining structures upon semiconductor device substrates.

Concurrent with ever-decreasing die sizes, the width (or diameter) of capacitor containers must be reduced. However, DRAM capacitors of sufficient size to store and maintain the requisite amount of charge to permit the necessary refresh time must still be provided.

Accordingly, it has been proposed to fabricate capacitor containers of dielectric materials having higher dielectric constants than materials typically utilized. However, a change in material would cause a substantial interference with existing semiconductor manufacturing processes and, thus, such solution is undesirable.

As capacitance is a function of the surface area of the capacitor, tremendous efforts have been made in the semiconductor industry to maintain or increase the surface areas of capacitors, despite a decrease in the widths of capacitor containers. By increasing the surface area of the container, and thus an electrode associated therewith, capacitance charge may be maintained, or even increased, for a capacitor container having a reduced width. Typically, surface areas of capacitors are increased by the formation of an enhanced surface area layer, such as a hemispherical grain (HSG) polysilicon layer, on the interior surface of the capacitor container. The HSG polysilicon layer increases the surface area of the capacitor container due to the three-dimensional hemispherical configuration and convolutions of the silicon. While this technique creates a capacitor container with an increased surface area relative to a similarly sized capacitor container that is not lined with HSG polysilicon, surface area is still limited by the confines of the capacitor container structure. That is, an HSG polysilicon-lined capacitor container having a smaller width will have a lesser surface area than an HSG polysilicon-lined capacitor container having a larger width, assuming the two capacitor containers have a substantially equivalent height.

A further approach to enhancing the total surface areas of capacitor containers involves modifying the geometrical layout of the containers. However, the usefulness of this technique is similarly limited by the confines of the capacitor container in that a particular geometrical layout in a capacitor container having a smaller width will have a lesser surface area than a similar geometrical layout in a capacitor container having a larger width and a substantially equivalent height.

As surface area is a function not only of the width of the capacitor container but also of the height thereof, a decrease in width accompanied by a proportional increase in height theoretically would provide a capacitor container having identical surface area. However, there are limitations to forming a large height-to-width ratio using known etching techniques due to the limitations of selective etching. For instance, preservation of the surface underlying the etched layer may become compromised if the aspect ratio of the capacitor container is too great.

As shown in FIG. 1 and previously described, integrated circuits, such as DRAM semiconductor device structures, typically include conductive structures 12, such as transistor gates, formed on the surface 16a of the semiconductor substrate 16. In addition to capacitor containers 22, semiconductor device structures 10 typically also include contact apertures (not shown) formed in the structural layer 20, generally by etching the structural layer 20. Like capacitor containers 22, contact apertures are typically cylindrical cavities formed contiguous with a conductive plug 11 (or an active device region 14 of the semiconductor substrate 16). Through these contact apertures, digit lines (not shown) can contact the source or drain regions (not shown) of the transistor formed in the semiconductor substrate 16, as desired.

As is apparent, if the height of a capacitor container 22 is increased to maintain the necessary capacitance, the height of the contact apertures (not shown) similarly must increase. However, due to reduced die sizes and increased feature densities, this height increase must occur without increasing the width (or diameter) of the contact aperture. However, as contact apertures typically are etched, formation of a large height-to-width ratio is limited by the limitations of selective etching, as previously described.

Based upon the above, the inventor has recognized that a semiconductor device structure, and method for manufacturing such structure, that has one or more capacitor containers, contact apertures, or other openings therein with increased height-to-width ratios over those which may be formed using conventional techniques would be desirable. Further, the inventor has recognized that a semiconductor device structure having one or more capacitor containers, contact apertures, or other openings therein with increased aspect ratios that is simple to manufacture and does not interfere significantly with existing manufacturing processes would be advantageous.

BRIEF SUMMARY OF THE INVENTION

The present invention includes semiconductor device structures and methods of making such structures that include one or more etched openings therein with increased height-to-width ratios, or aspect ratios. The structures of the present invention are formed by successive layer deposition wherein etching is affected, generally in a step-wise fashion, as the height of the semiconductor device structure is increased.

The present invention further includes semiconductor device structures and methods of making such structures that include one or more capacitor containers, contact apertures, or other openings therein having increased aspect ratios. The semiconductor device structures are formed by stacking an interlayer or cover layer atop a first structural layer and, subsequently, stacking a second structural layer atop the cover layer. Stepwise etching of capacitor containers, contact apertures, or other openings in the first and second structural layers and the cover layer provides increased height-to-width ratios of the resultant capacitor containers, contact apertures, or other openings.

Further, the present invention includes semiconductor device structures and methods of making such structures in which capacitor containers, contact apertures, or other openings having increased aspect ratios are formed by deposition of a second structural layer directly atop an etched first structural layer. Process conditions of the material of the second structural layer may be adjusted such that substantial non-conformity and low step coverage are achieved. Subsequent etching of the second structural layer results in semiconductor device structures with one or more capacitor containers, contact apertures, or other openings therein that have increased height-to-width ratios relative to those which may be formed using currently known techniques.

Additionally, the present invention includes a method for self-aligning openings in substantially vertically stacked structural layers of a semiconductor device structure. Etching of the structural layers, generally in a stepwise fashion, may result in semiconductor device structures having openings therein with increased aspect ratios.

Additional aspects of the invention, together with the advantages and novel features pertaining thereto, will be set forth in the description which follows and will also become readily apparent to those of ordinary skill in the art upon examination of the following and from the practice of the invention.

BRIEF DESCRIPTION OF THE DRAWINGS

In the accompanying drawings which form a part of the specification and are to be read in conjunction therewith.

DETAILED DESCRIPTION OF THE INVENTION

The present invention is directed to semiconductor device structures and methods of making such structures that include one or more capacitor containers, contact apertures, or other openings therein with increased height-to-width ratios. The particular embodiments described herein are intended in all respects to be illustrative rather than restrictive. Alternative embodiments will become apparent to those of ordinary skill in the art to which the present invention pertains without departing from its scope.

Figure 1:
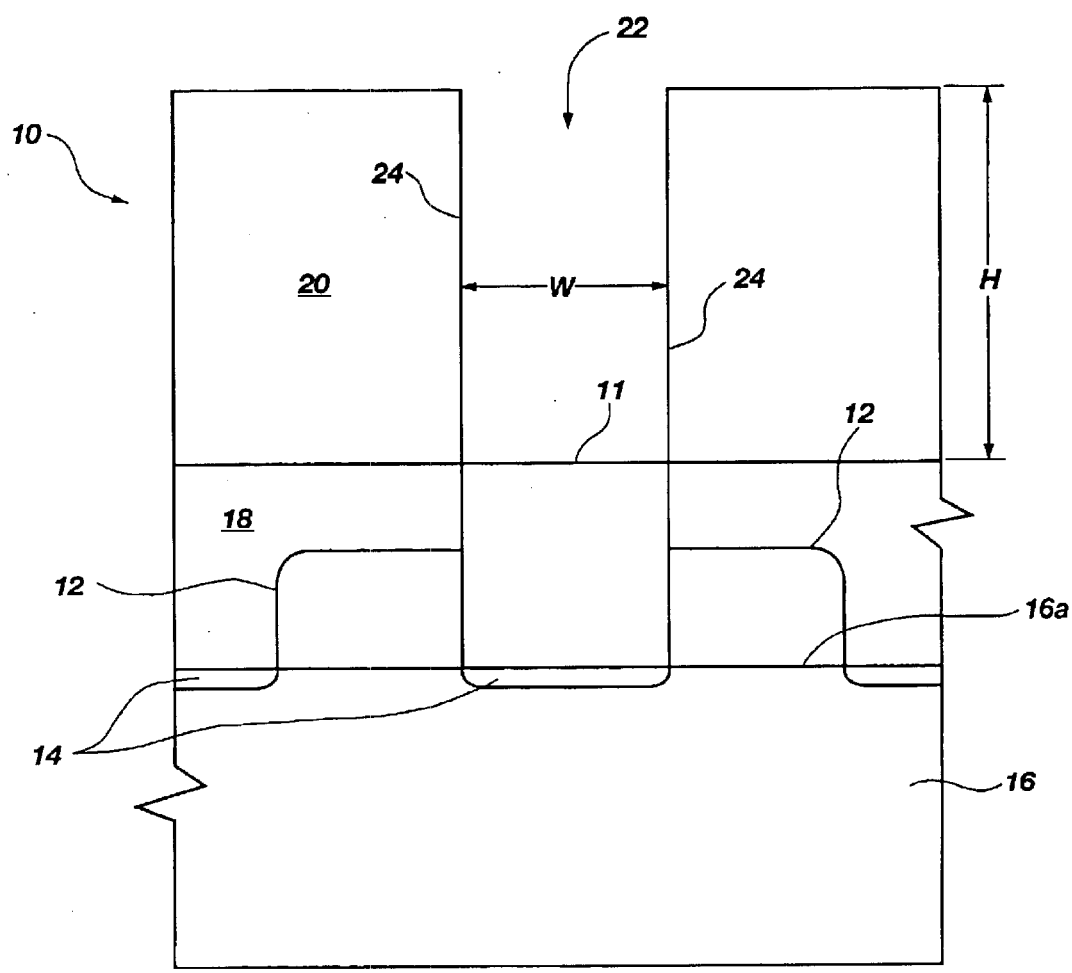
FIG. 1 is a schematic illustration of a prior art partially fabricated semiconductor device structure for use in integrated circuits such as DRAM semiconductor devices.
Figure 2:
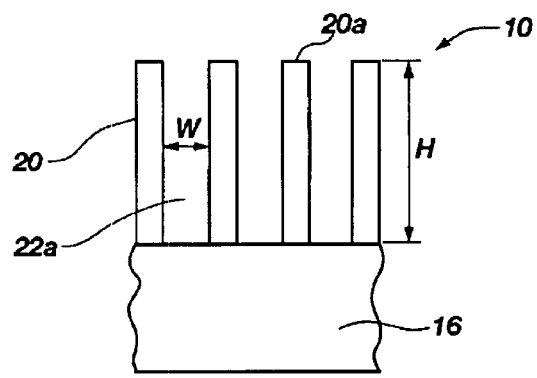
FIG. 2 is a schematic illustration of a semiconductor device structure having a plurality of capacitor containers therein. The semiconductor substrate, conductive structure and insulating layer are not shown in detail for the sake of simplicity and ease of description. However, it will be understood by those of ordinary skill in the art that the semiconductor device structure schematically illustrated herein may be of any conventional design, having all the components and materials so associated.

Referring initially to FIG. 2, an exemplary semiconductor device structure 10 is shown. The semiconductor device structure of FIG. 2 includes a plurality of capacitor container portions 22a formed in a first structural layer 20, such as a phosphosilicate glass (PSG) layer, a borosilicate glass (BSG) layer, or a borophosphosilicate glass (BPSG) layer. Conventional techniques for forming a semiconductor device structure as depicted in FIG. 2 are known in the art and will not be further discussed herein. It will be understood that the semiconductor device structure shown in FIG. 2 further includes at least a semiconductor substrate 16, conductive structure 12 and insulating layer 18 underlying the illustrated portion of the structure, as discussed above in relation to FIG. 1. Such underlying structure is not depicted in FIGS. 2 and 3A–3G for the sake of convenience and ease of description. Capacitor container portions 22a have a width (or diameter, as the capacitor container portions 22a may be substantially cylindrical cavities as previously described), represented herein as W and first structural layer 20 has a height represented herein as H.

Using known conventional etching techniques, a maximum height-to-width ratio of each capacitor container portion 22a (or other opening in the structural layer 20) of 7:1 may be achieved while maintaining the integrity of the surface underlying the etched layer and, accordingly, the accuracy of the photolithographic image. Thus, the ratio of height to width in FIG. 2 cannot exceed 7:1 using conventional etching techniques. The present invention teaches methods which may be used to overcome this limitation, i.e., for forming semiconductor device structures capable of having openings (e.g., capacitor containers 22) therein with aspect ratios greater than 7:1.

According to the present invention, narrow capacitor containers (i.e., those with increased height-to-width ratios) may be formed by successive deposition of layers. Multiple structural layers 20, 26 (e.g., BPSG matrix layers) may be formed substantially vertically on top of one another by stacking a second structural layer 26 substantially vertically on top of an etched first structural layer 20 and subsequently etching into the second structural layer 26 a pattern substantially identical to the pattern etched in the first structural layer 20. As is evident, during and subsequent to deposition of the second structural layer 26, the integrity of the first structural layer 20 should be substantially maintained. That is, any openings (e.g., capacitor container portions 22a) in the first structural layer 20 should remain substantially devoid of any material therein and the first structural layer 20 should not be damaged during and subsequent to deposition of the second structural layer 26. To achieve this result, a thin cover layer 25, or interlayer, may be deposited on the top surface 20a of the etched first structural layer 20 prior to deposition of the second structural layer 26 on top thereof.

The first cover layer 25 may be deposited using various methods known in the art. By way of example and not limitation, chemical vapor deposition (CVD) techniques (such as plasma-enhanced chemical vapor deposition (PECVD)) or physical vapor deposition (PVD) techniques (such as sputtering) may be used to deposit the first cover layer 25. The first cover layer 25 may be formed of a substantially nonconforming material having low step coverage such that it does not substantially spill into any openings (e.g., capacitor container portions 22a) in the first structural layer 20 but, in effect, seals any openings in the first structural layer 20 and substantially prevents the material of the second structural layer 26 (or any other material) from spilling into the openings.

Once the first cover layer 25 has been deposited and seals the openings (e.g., capacitor container portions 22a) in the first structural layer 20, the second structural layer 26 may be deposited on the top surface 25a of the first cover layer 25 using any of various methods known in the art, such as chemical vapor deposition (CVD), spin-on-glass (SOG), physical vapor deposition (PVD), e.g., such as sputtering, and the like. Subsequently, a photoresist layer (not shown) may be deposited on the top surface 26a of the second structural layer 26 and etched to form a photomask (not shown) through which the second structural layer 26 may be patterned, as known in the art. By way of example, and not limitation, one or more of glow-discharge sputtering, ion milling, reactive ion etching (RIE), reactive ion beam etching (RIBE), plasma etching, point plasma etching, magnetic ion etching, magnetically enhanced reactive ion etching, plasma enhanced reactive ion etching, electron cyclotron resonance and high-density plasma etching may be used to form openings (e.g., capacitor container portions 22b) in second structural layer 26 which provide access to the top surface 25a of first cover layer 25. Utilizing the photoresist (not shown) applied to the second structural layer 26, a substantially equivalent pattern may be etched into the first cover layer 25 using the same etchant, different etchants, or a combination of etchants. Accordingly, capacitor container portions 22c are formed in the first cover layer 25 which substantially vertically align with, and may provide access to, the capacitor container portions 22a in the first structural layer 20. The capacitor container portions 22c in the first cover layer 25 also align substantially vertically with the capacitor container portions 22b in the second structural layer 26. As such, a continuous capacitor container 22 (or other opening) comprised of capacitor container portions 22b, 22c and 22a may be formed, through which access to the underlying areas of the semiconductor device structure, e.g., active areas (not shown) of semiconductor substrate 16, may be provided.

As a photoresist (not shown) is used and patterned to form a photomask (not shown) that has an image substantially identical to that utilized to etch the first structural layer 20, etching of the second structural layer 26 and the first cover layer 25 creates openings (e.g., capacitor container portions 22b and 22c, respectively) that provide access to capacitor container portions 22a defined by the first structural layer 20. Thus, the capacitor container portions 22a, 22b in the first structural layer 20 and the second structural layer 26, respectively, as well as the container portion 22c in the first cover layer 25, may be connected and a semiconductor device structure 10 having a capacitor container 22 (or other opening) therein with an increased aspect ratio may be formed. This process is schematically illustrated in FIGS. 3A–3D.

Fabrication of the first structural layer 20, including a lowermost container portion 22a of at least one capacitor container 22 etched therein, may be formed as described above and as shown in FIG. 2. Although the present discussion centers around formation of capacitor containers (or contact apertures), it will be understood and appreciated by those of ordinary skill in the art that the methods of the present invention may be used to form semiconductor device structures having etched openings therein for a variety of applications. All such uses of the present technology are intended to be within the scope of the present invention.

Figure 3A:
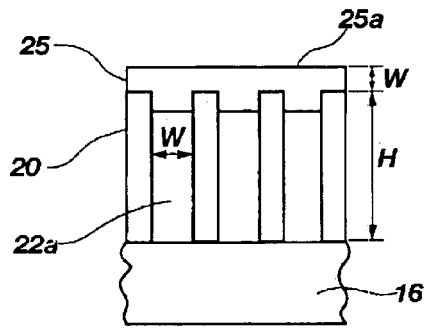
FIGS. 3A–3D schematically illustrate the formation of a semiconductor device structure having one or more capacitor containers therein with increased height-to-width ratios in accordance with an embodiment of the present invention.

After patterning of a photoresist (not shown) to form a photomask (not shown) and etching of the first structural layer 20, a first cover layer 25 may be deposited on the top surface 20a of the etched first structural layer 20, as shown in FIG. 3A. The thickness of the first cover layer 25 may approximate the widths of the capacitor containers 22 so that little material of the first cover layer 25 protrudes into the capacitor container portions 22a defined by the first structural layer 20 and yet the integrity of the first structural layer 20 may be substantially maintained during the stacked fabrication of subsequent structural layers, as more fully described below. The first cover layer 25 may be formed of any material, the process conditions of which are controlled such that the material will not substantially conform to the top surface 20a of the first structural layer 20. Stated differently, the first cover layer 25 may remain substantially planar and not substantially protrude into the container portions 22a defined by the first structural layer 20. By way of example and not limitation, the first cover layer 25 may be formed from a high-density plasma (HDP) oxide, a low silane oxide (LSO), a PECVD oxide, an oxide deposited by use of tetraethylorthosilicate (TEOS), another silicon oxide, silicon nitride, or combinations thereof.

Figure 4A:
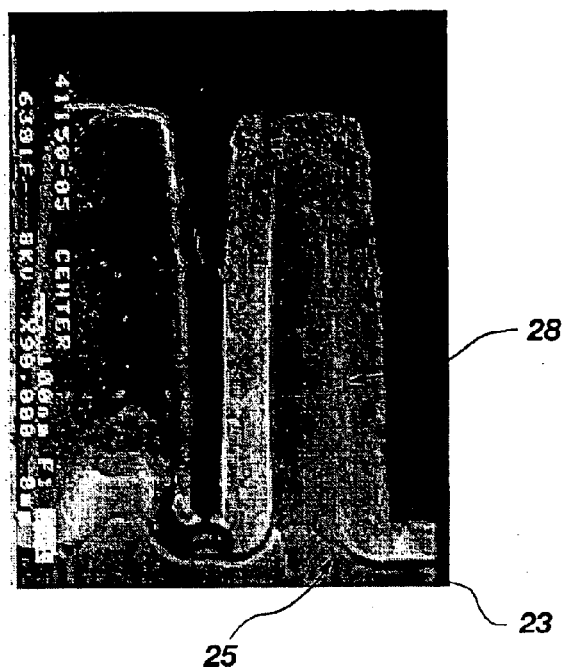
FIG. 4A is an electron micrograph of a semiconductor device structure in accordance with the teachings of the present invention taken in cross section at a central location of the semiconductor substrate. The electron micrograph illustrates that the cover layer generally remains on the surface of the structural layer and does not substantially fill the capacitor container.
Figure 4B:
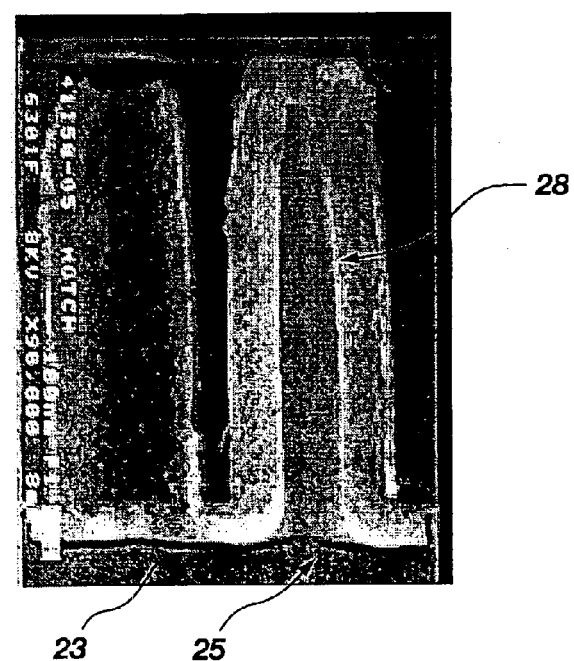
FIG. 4B is an electron micrograph of a semiconductor device structure in accordance with the present invention taken in cross section at a notch of the semiconductor substrate. The electron micrograph illustrates that the cover layer generally remains on the surface of the structural layer and does not substantially fill the capacitor container.

The first cover layer 25 may be formed by various methods known in the art. By way of example, and not limitation, chemical vapor deposition (CVD) techniques (such as plasma-enhanced chemical vapor deposition (PECVD)) or physical vapor deposition (PVD) techniques (such as sputtering) may be used to form the first cover layer 25 by adjusting the process conditions to achieve poor conformity and poor step coverage so that the deposited material of the first cover layer 25 grows only on the top surface 20a of the first structural layer 20. FIGS. 4A and 4B show a portion of a semiconductor device structure 10 having a capacitor container 22 therein and a cover layer 25 formed in this manner. FIGS. 4A and 4B each show a cross-section of an HDP oxide cover layer 25 deposited at low temperature on a capacitor container 22, the semiconductor device structure 10 having a tungsten nitride (WN) bottom electrode 28. FIG. 4A shows a cross section taken at a central location of the semiconductor substrate 16. FIG. 4B shows a cross section taken at a notch of the semiconductor substrate 16. The images clearly show that the first cover layer 25 covers only the top surface 23 of the capacitor container 22 and that the material thereof does not substantially protrude into the capacitor containers 22.

As is evident from FIG. 3A, the material of the first cover layer 25 is likely to protrude into the capacitor containers 22 to some extent. However, a cover layer 25 formed under process conditions as previously described is unlikely to spill into the capacitor containers 22 to a depth that exceeds the thickness of the cover layer 25 itself, such thickness represented in FIG. 3A as W.

Figure 3B:
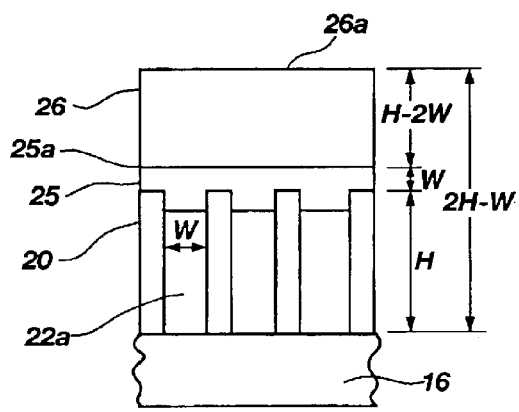
Figure 3C:
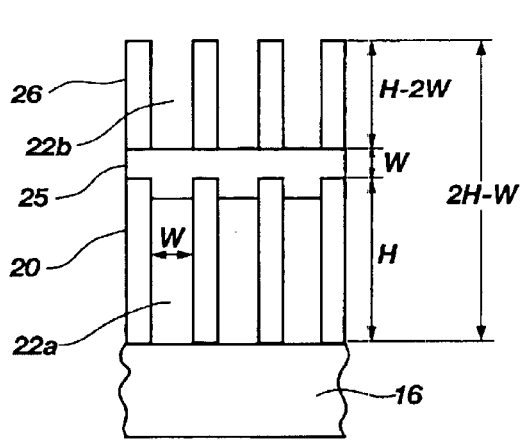

As illustrated in FIG. 3B, after the first cover layer 25 has been deposited atop the surface 20a of first structural layer 20, a second structural layer 26, formed of a BPSG matrix or similar material, may be deposited on the top surface 25a of the first cover layer 25. Second structural layer 26 may be formed by various methods known in the art including, without limitation, chemical vapor deposition (CVD) and the like. Subsequently, a photoresist (not shown) may be applied to the top surface 26a of the second structural layer 26 and patterned to form a photomask (not shown) through which the second structural layer 26 may be etched, as known in the art, to form capacitor container portions 22b therein through which access to the top surface 25a of first cover layer 25 may be provided. This step is illustrated in FIG. 3C.

Figure 3D:
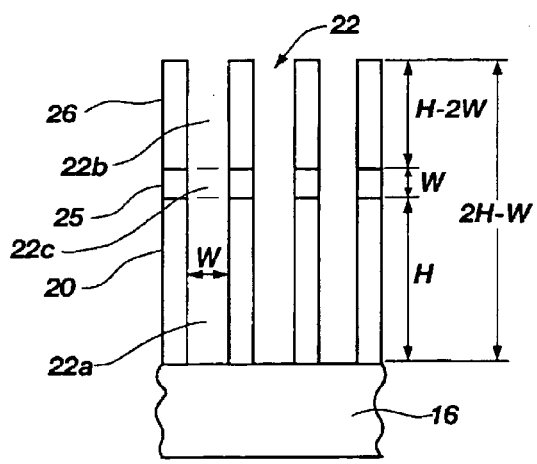

Subsequently, the first cover layer 25 may be separately patterned using second structural layer 26 as a mask. Alternatively, the first cover layer 25 may not be separately patterned. In any event, the first cover layer 25 may be patterned such that access may be provided to the capacitor container portions 22a defined by the first structural layer 20. This step is shown in FIG. 3D.

The etchant or etchants used to etch the second structural layer 26 and the first cover layer 25 are, of course, formulated to remove the material or materials of these layers and may do so with selectivity over the material or materials of the other layers or structures that will be exposed to such etchants. Such processes and etchants are known in the art. The second structural layer 26 and the first cover layer 25 may be etched using the same etchant such that the steps illustrated in FIGS. 3C and 3D occur substantially simultaneously. Alternatively, etchants selective for the various layers may be used such that steps 3C and 3D occur in a stepwise fashion, as illustrated. Examples of selective etchants and methods for using the same are disclosed in U.S. Pat. No. 6,117,791, which is hereby incorporated by this reference as if reproduced in its entirety herein.

Because a photoresist (not shown) may be used to form a photomask (not shown) that has an image substantially identical to that utilized to etch the capacitor container portions 22a in the first structural layer 20, etching of the second structural layer 26 and the first cover layer 25 creates openings therein (capacitor container portions 22b, 22c, respectively) which may provide access to the capacitor container portions 22a defined by the first structural layer 20. The result is a semiconductor device structure 10 having capacitor containers 22 with aspect ratios that may be increased substantially over those of a semiconductor device structure having only a single etched structural layer.

As best seen in FIG. 3A, the widths (or diameters) of the capacitor containers 22 may be substantially equal to the thickness of first cover layer 25. This approximate equivalence may be useful for achieving an increased aspect ratio while still having little or no material of the first cover layer 25 protrude into the capacitor container portions 22a. Further, as mentioned above, while the material of the first cover layer 25 may enter the capacitor container portions 22a defined by the first structural layer 20 to some extent, the depth of material inside the container portions 22a should not exceed the thickness W of the first cover layer 25. Thus, the depth of the material of first cover layer 25 inside of capacitor container portions 22a should not exceed W.

As previously mentioned, a maximum aspect ratio of about 7:1 may be achieved using known conventional etching techniques. Because both the second structural layer 26 and the first cover layer 25 must be etched to connect the capacitor container portions 22b and 22c, respectively, to the capacitor container portions 22a defined by the first structural layer 20, as must any material of the first cover layer 25 that has protruded into the container portions 22a of the first structural layer 20, the combination of the height of the second structural layer 26, the thickness of the first cover layer 25, and the depth that material of the first cover layer 25 extends into container portions 22a cannot exceed H. Thus, assuming the thickness of the first cover layer 25 is about equal to the width W of the capacitor container portions 22a formed in first structural layer 20, and that the material of the first cover layer 25 protrudes into the container portions 22a a distance of about W, capacitor containers 22 with a height of about 2H−W may be formed utilizing known conventional etching techniques and the layered fabrication methods of the present invention. Such a capacitor container 22 would have a height-to-width ratio of about 2H−W:W. Thus, for example, if W=1 and H=7 (the approximate maximum aspect ratio condition available using current etching techniques), a capacitor container 22 with an aspect ratio of 13:1 may be achieved by forming a second structural layer 26 atop the first structural layer 20 using the teachings of the present invention.

As will be understood and appreciated by those of ordinary skill in the art, this technique theoretically could be repeated for an unlimited number of structural layers creating capacitor containers having very large aspect ratios. For instance, formation of a second cover layer and third structural layer would result in a maximum aspect ratio of 3H−2W:W or 19:1. Similarly, formation of a third cover layer and fourth structural layer would result in a maximum aspect ratio of 4H−3W:W or 25:1.

Figure 3E:
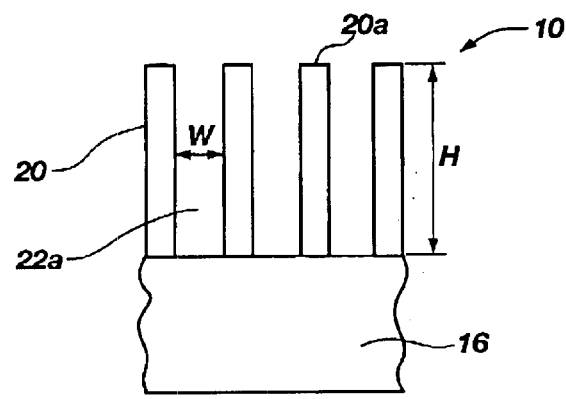
FIGS. 3E–3G schematically illustrate the formation of a semiconductor device structure having one or more capacitor containers therein with increased height-to-width ratios in accordance with another embodiment of the present invention.
Figure 3F:
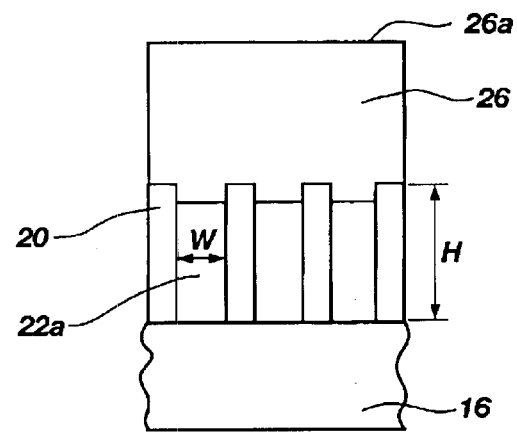
Figure 3G:
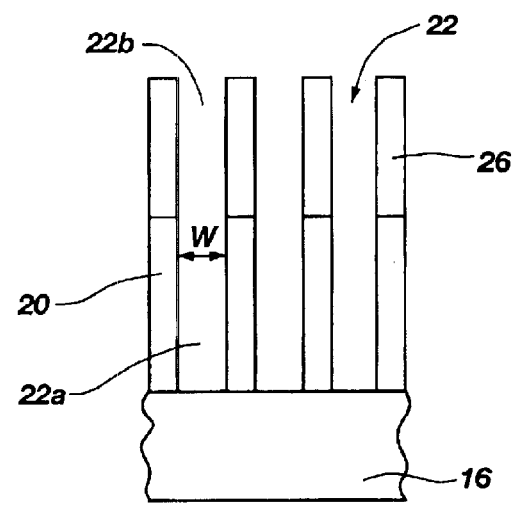

In another embodiment, a second structural layer 26 may be deposited directly atop the first structural layer 20 by adjusting the process conditions thereof, as known in the art, to achieve poor conformity and poor step coverage employing a known deposition technology, such as those discussed above with regard to the deposition of the first cover layer 25. If the process conditions of the second structural layer 26 are adjusted in this manner, the second structural layer 26 may be deposited directly onto the top surface 20a of etched first structural layer 20 without the need for a first cover layer 25, as the material of the second structural layer 26 would not substantially protrude into the capacitor container portions 22a defined by first structural layer 20. Using this alternative process, semiconductor device structures may be fabricated in fewer process steps than as described above in reference to FIGS. 3A–3D, as there would not be one or more separate cover layers 25 to be fabricated or etched. This embodiment is illustrated in FIGS. 3E–3G.

As previously discussed, and as shown in FIG. 1, integrated circuits, such as DRAM semiconductor device structures 10, typically include transistor gates as conductive structures 12 built on the surface 16a of a semiconductor substrate 16, e.g., a silicon (Si) wafer. Accordingly, in addition to capacitor containers 22, semiconductor devices also typically include contact apertures 30 (not shown) formed through an insulating layer 18 (e.g., a BPSG layer) through which protective conductive plugs 11 may extend to electrically connect the digit lines and the source or drain regions of the transistors, as desired. Alternatively, contact apertures 30 may be formed to electrically connect digit lines with active device regions 14 of the semiconductor substrate 16 in the absence of conductive plugs 11.

If the height of a semiconductor device structure is increased according to the teachings of the present invention, the heights of the contact apertures must similarly increase. However, due to the trend in the semiconductor industry of reduced die sizes, it may be desirable for this height increase to occur without increasing the widths (or diameters) of the contact apertures 30. However, as contact apertures 30 are typically etched, forming apertures with large height-to-width ratios is limited by conventional etching techniques, just as it was limited with regard to capacitor containers 22.

The methods of the present invention may be employed to form contact apertures 30 with increased aspect ratios as well as to form capacitor containers 22, as previously described. In semiconductor device structures having both capacitor containers 22 and contact apertures 30, it may be desirable to form such features simultaneously or in a stepwise fashion. FIGS. 5A–7 schematically illustrate various methods of forming semiconductor device structures, such as DRAM semiconductor devices, according to the methods of the present invention.

In each of FIGS. 5A–7, a semiconductor substrate 16, e.g., a silicon (Si) wafer, having a plurality of active device regions 14 (or source/drain regions) which typically comprise conductively doped regions of the semiconductor substrate 16 is formed and covered with an insulating layer 18, such as a borophosphosilicate glass (BPSG) layer, as previously described. If desired, semiconductor substrate 16 may also include conductive plugs 11 located between neighboring conductive structures 12 to protect the underlying active device regions 14, as shown.

Figure 5A:
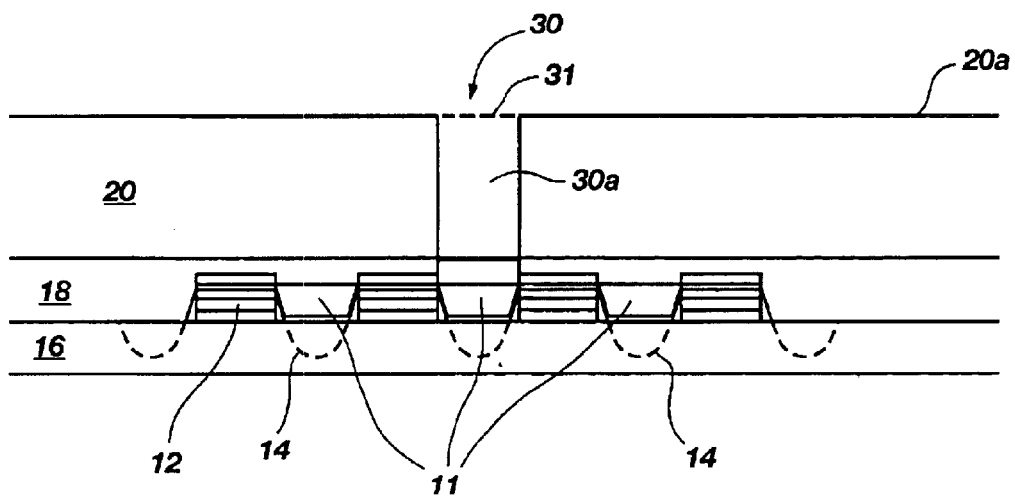
FIGS. 5A–5J schematically illustrate an exemplary method for the formation of a semiconductor device structure having both a contact aperture and a plurality of capacitor containers therein with increased aspect ratios.

Referring now to FIG. 5A, in an exemplary method, a first structural layer 20 (e.g., a BPSG layer) may be deposited atop the insulating layer 18. Subsequently, a photoresist layer (not shown) may be applied to the first structural layer 20 and patterned (i.e., selectively exposed and developed) to form a photomask (not shown). The first structural layer 20 may be etched to form a lowermost portion 30a of a contact aperture 30 therein. Contact aperture portion 30a may be patterned at a location in the first structural layer 20 such that it aligns substantially vertically with a conductive plug 11, as shown, or an active device region 14 of the semiconductor substrate 16, if desired, and provides access thereto. It will be understood by those of ordinary skill in the art that a portion of the insulating layer 18 may also be patterned such that the lowermost portion 30a of the contact aperture 30 may be exposed to the conductive plug 11 (or active substrate region, if desired). It is noted that fabrication of semiconductor devices having such structures is carried out with respect to multiple contact apertures 30 and multiple capacitor containers 22 substantially simultaneously. However, for sake of clarity, only one such contact aperture 30 and its relation to capacitor containers 22 on either side thereof is depicted in the figures.

Figure 5B:
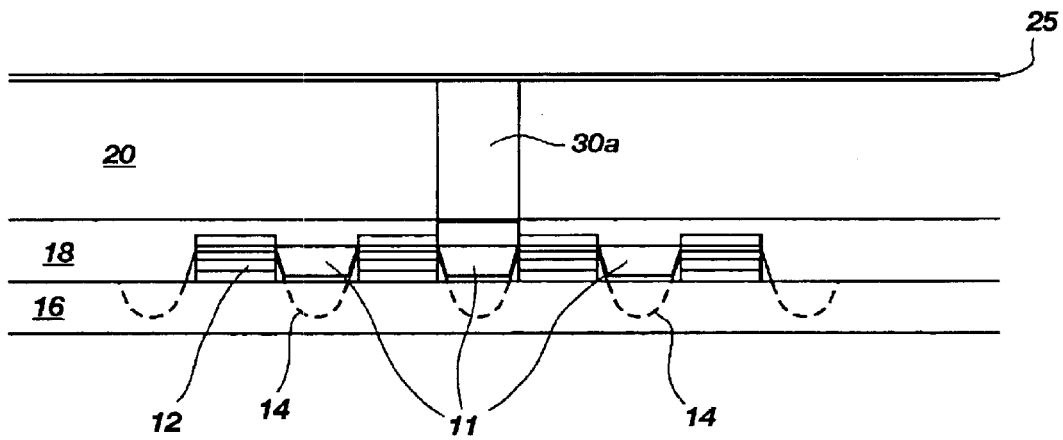

After forming the lowermost portion 30a of contact aperture 30, a first cover layer 25 (for example, an HDP oxide layer) may be deposited on the top surface 20a of the first structural layer 20 to cover the top surface 31 of the lowermost portion 30a of the contact aperture 30 without substantially protruding into the lowermost portion 30a of the contact aperture 30, as illustrated in FIG. 5B. First cover layer 25 may be formed substantially as discussed above with reference to FIG. 3B. It is noted that while FIGS. 5A–5J are not shown to scale, the width of contact aperture portion 30a and the thickness of first cover layer 25 closely approximate one another, as previously discussed, with respect to the thickness of the first cover layer 25 and the width of the container portion 22a depicted in FIG. 3B. Further, while not shown herein, it is likely that material from the first cover layer 25 will protrude into the contact aperture portions 30a or other openings in the first structural layer 20 to some extent, as described above.

Figure 5C:
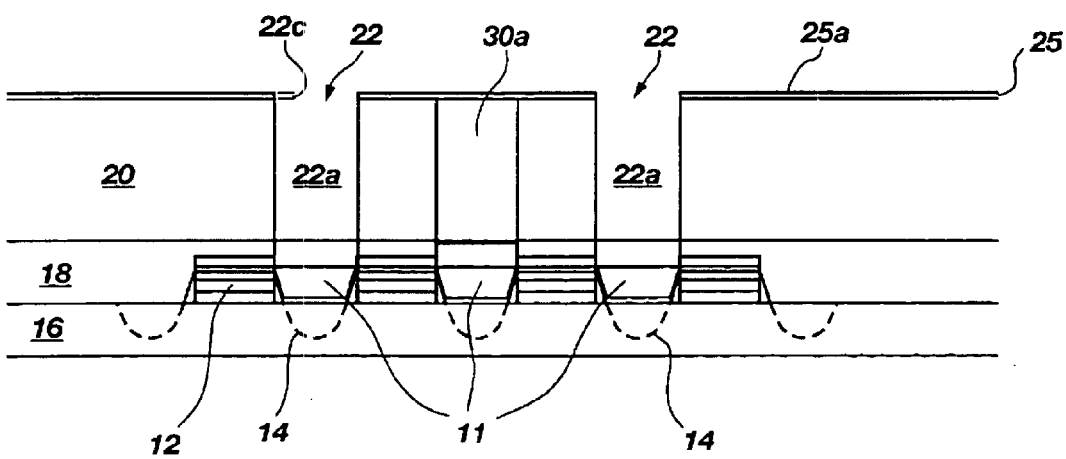

Subsequent to application of the first cover layer 25, the cover layer 25 may be patterned to form the container portion 22c of one or more capacitor containers 22. Such patterning may also be effected through first structural layer 20. Again, it will be understood that a portion of insulating layer 18 may also be etched such that each capacitor container portion 22a is exposed to a conductive plug 11. By patterning contact aperture 30 and capacitor containers 22 in a stepwise fashion as shown in FIGS. 5A–5C, the contact aperture portion 30a remains substantially sealed during deposition and etching of the second structural layer 26, as well as through the formation of the capacitors 32, as more fully described below.

Figure 5D:
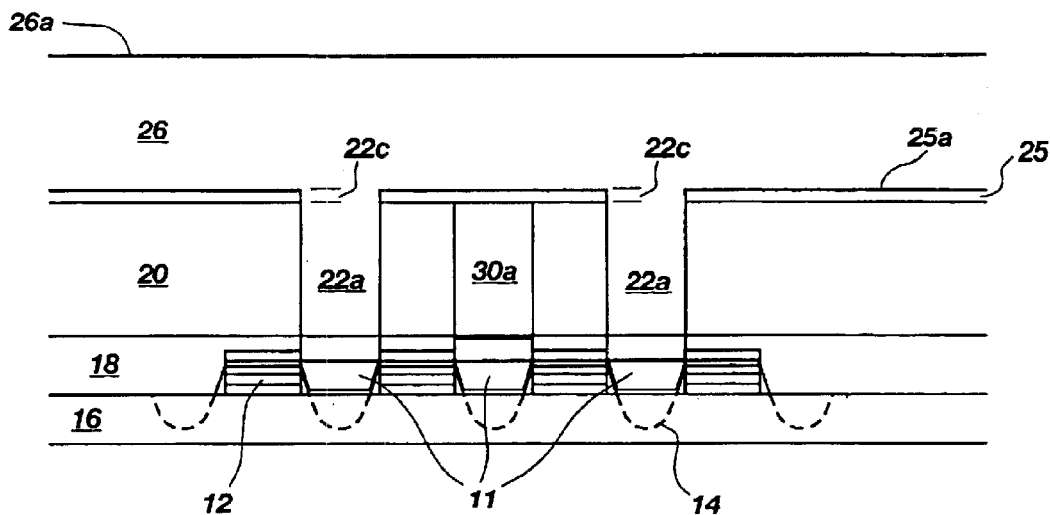

As shown in FIG. 5D, a second structural layer 26 may subsequently be deposited on the top surface 25a of the first cover layer 25. Again, the second structural layer 26 may be deposited by any of various methods known in the art including, without limitation, CVD and the like. Alternatively, the need for a first cover layer 25 may be eliminated by preventing the material of the second structural layer 26 from substantially protruding into the capacitor container portions 22a, the deposition conditions of the second structural layer 26 being adjusted to achieve poor conformity and poor step coverage, as previously described.

Figure 5E:
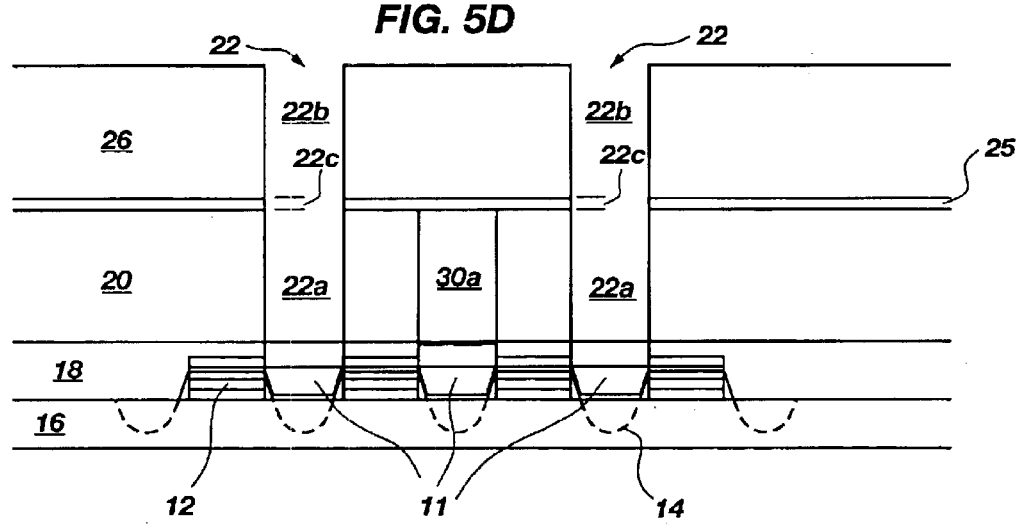

Next, a photoresist layer (not shown) may be deposited on the top surface 26a of the second structural layer 26 and patterned to form a photomask (not shown) and the second structural layer 26 may be patterned to form capacitor container portions 22b therein. As a photoresist (not shown) may be used that has an image substantially identical to that employed to pattern the first cover layer 25, etching of the second structural layer 26 may provide access to the capacitor container portions 22a defined by the first structural layer 20. This step is shown in FIG. 5E. The result is a semiconductor device structure 10 having capacitor containers 22 therein with increased height-to-width ratios.

Figure 5F:
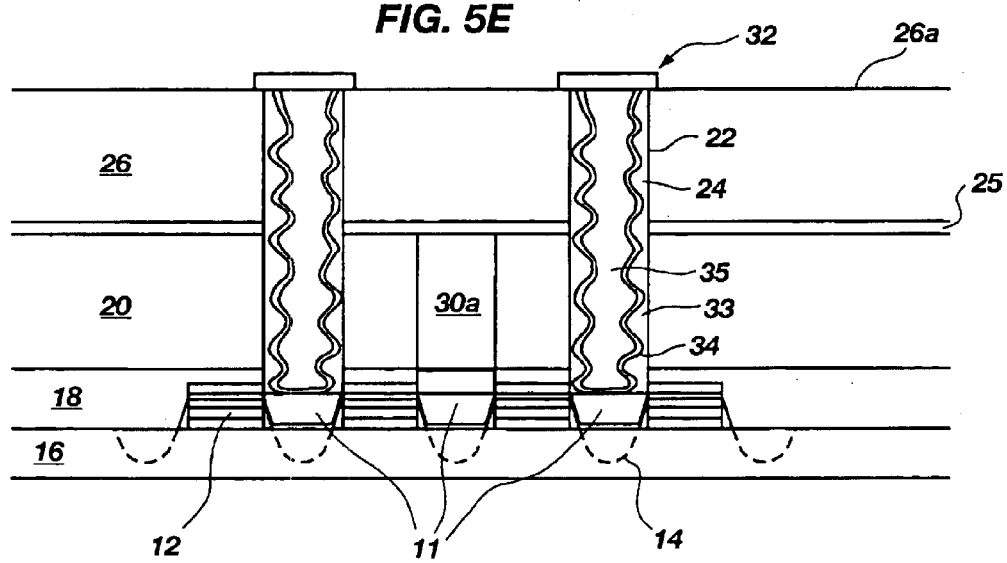
Figure 5G:
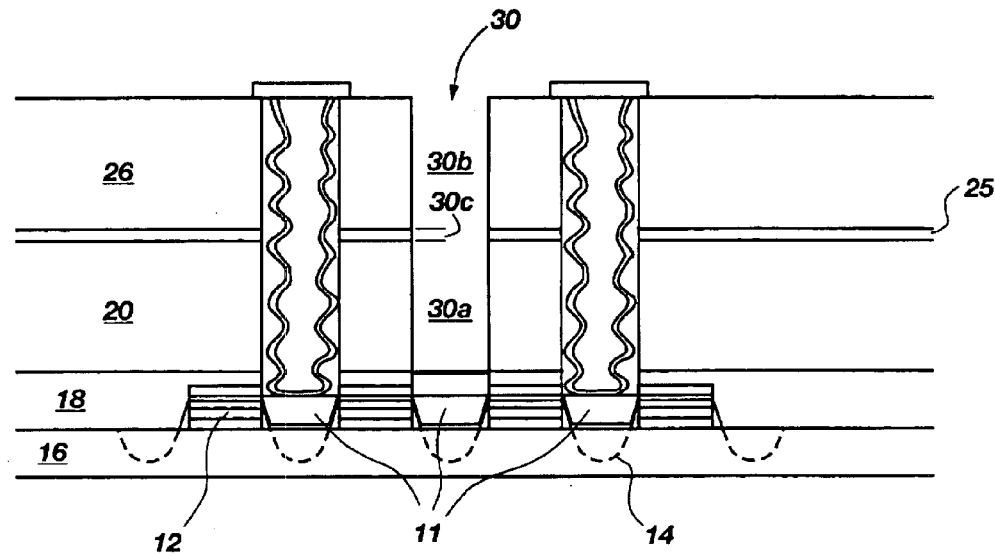

Subsequently, as shown in FIG. 5F, capacitors 32 may be formed in each of the capacitor containers 22 by depositing a layer 33 of any suitable conductive material (e.g., a conductively doped hemispherical grain (HSG) polysilicon layer) on the interior sidewalls 24 of the container 22, followed by deposition of a dielectric layer 34 and another conductive layer 35, as known in the art. Next, a photoresist layer (not shown) may be applied and patterned to form a photomask (not shown) on the top surface 26a of the second structural layer 26 and the second structural layer 26 may be etched to form a contact aperture portion 30b of at least one contact aperture 30 therein. The first cover layer 25 may be patterned using the same etchant, different etchants, or a combination of etchants, as previously described. As a photoresist (not shown) is used and patterned to form a photomask (not shown) in this instance that has an image substantially identical to that utilized to form the contact aperture portion 30a through first structural layer 20, etching of the second structural layer 26 and the first cover layer 25 creates openings which provide access to the contact aperture portion 30a. This step is illustrated in FIG. 5G. The result is a contact aperture 30 with an increased aspect ratio relative to that which previously could be achieved using conventional selective etching techniques.

Figure 5H:
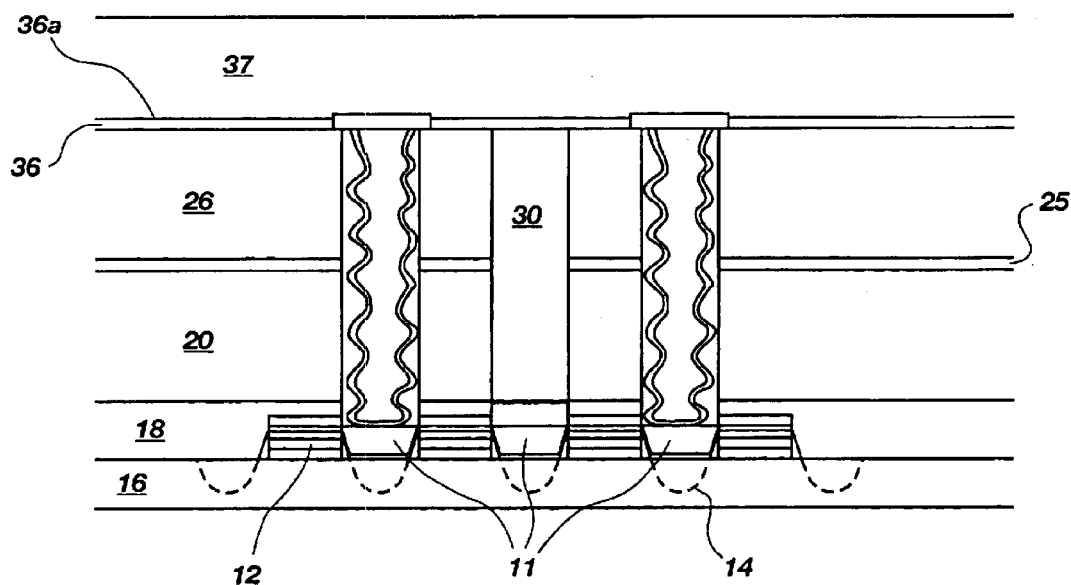

Subsequently, a second cover layer 36 may be deposited on top of etched second structural layer 26 to shield the capacitor container portions 22c (not shown) formed in the first cover layer 25 from subsequent processes. Again, while not shown to scale, it will be understood that the second cover layer 36 has a thickness which closely approximates the width of the capacitor containers 22 and the contact apertures 30, as previously discussed. The second cover layer 36 may be formed of materials and using methods as previously described with regard to first cover layer 25. A third structural layer 37 may then be deposited, for instance, by CVD, PVD, or the like, on the top surface 36a of the second cover layer 36, as shown in FIG. 5H.

Figure 5I:
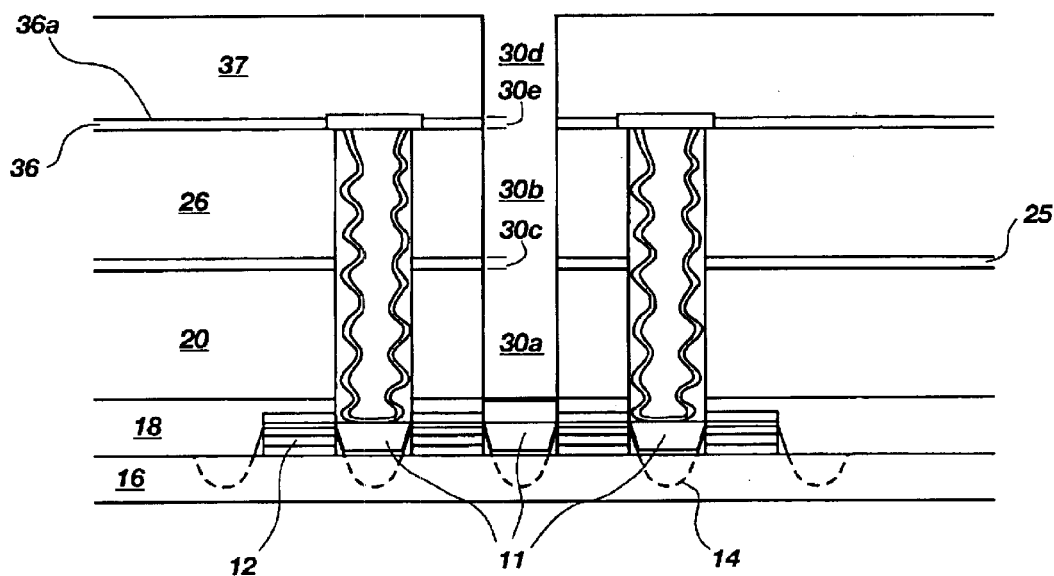

Next, the third structural layer 37 may be etched as known in the art (e.g., by mask and etch processes) to form a contact aperture portion 30d therein. The second cover layer 36 may also be etched using either the same etchant, a different etchant, or a combination of etchants, as previously described, to form contact aperture portion 30e. In this instance, a photoresist (not shown) may be used and patterned to form a photomask (not shown) that has an image substantially identical to that employed to pattern and etch the contact aperture portions 30a, 30b and 30c, respectively, into the first structural layer 20, the second structural layer 26 and the first cover layer 25. Thus, this etching step provides access to the contact aperture portions 30a and results in a contact aperture 30 having an even further increased aspect ratio. This step is shown in FIG. 5I.

Figure 5J:
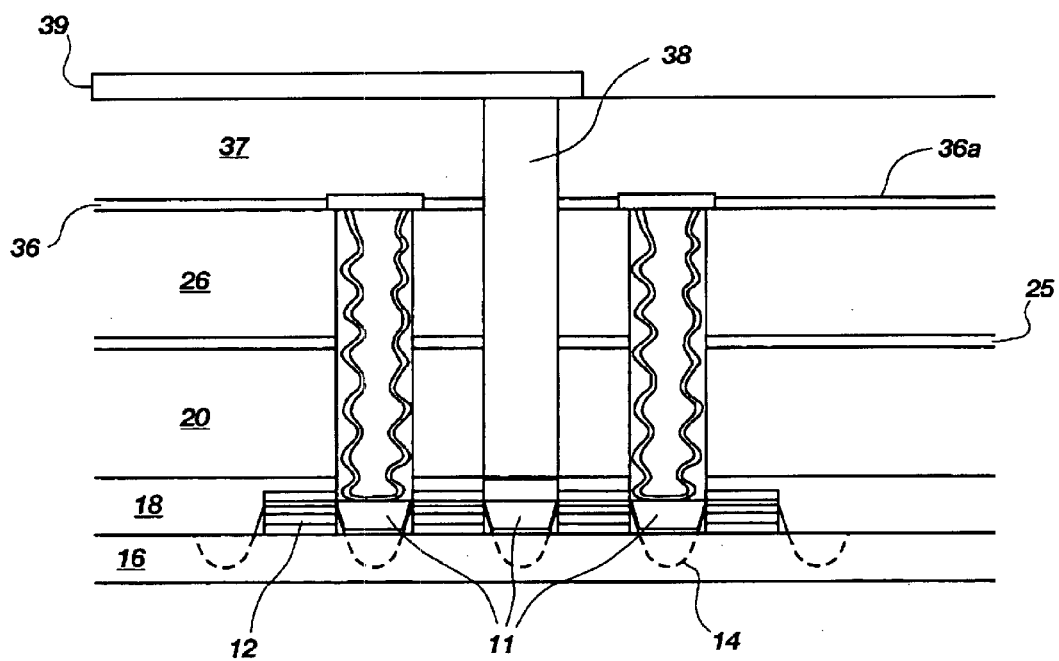

Finally, as shown in FIG. 5J, a conductive metal, such as tungsten, may be deposited into contact aperture 30 to form a conductive plug 38 and a conventional metal 39 may be deposited atop a portion of the third structural layer 37 to electrically connect the conductive plug 38 and from which digit lines (not shown) are subsequently formed. Such processes are known to those of ordinary skill in the art and will not be further discussed herein.

In another embodiment, the conductive metal, e.g., tungsten, may be deposited in the contact aperture 30 in stepwise fashion as the various portions 30a, 30b, 30c, 30d, 30e of the contact aperture 30 are patterned and etched. This method may be desirable if the processes of the memory capacitor will affect the stability of the contact apertures 30 as they exist in the system.

Referring now to FIGS. 6A–6G, in another exemplary method of forming semiconductor device structures 10 having both contact apertures 30 and capacitor containers 22, a first structural layer 20 (e.g., a BPSG layer) may be initially deposited on the top surface 18a of an insulating layer 18 that surrounds the active device regions 14 of a semiconductor substrate 16, as previously described. Subsequently, a photoresist layer (not shown) may be deposited on the top surface 20a of the first structural layer 20 and patterned to form a photomask (not shown). The first structural layer 20 may be patterned to form a lowermost portion 30a of at least one contact aperture 30 therein, as well as the lowermost portions 22a of capacitor containers 22 on either side thereof. The contact aperture portion 30a and the capacitor container portions 22a may be etched at a location in the first structural layer 20 such that each aligns substantially vertically with an active device region 14 of the semiconductor substrate 16 (or a conductive plug 11, if desired) and provides access thereto. It will be understood by those of ordinary skill in the art that a portion of the insulating layer 18 also may be patterned such that the lowermost portion 30a of the contact aperture 30 and the lowermost portions 22a of the capacitor containers 22 may be exposed to the respective conductive plugs 11 (or active device region 14, if desired). It is again noted that fabrication of semiconductor device structures with such features is typically carried out with respect to multiple contact apertures 30 and multiple capacitor containers 22 substantially simultaneously. However, for the sake of clarity, only one such contact aperture 30 and its relation to capacitor containers 22 on either side thereof are depicted in the figures.

After forming the lowermost portion 30a of the contact aperture 30 and the lowermost portions 22a of the capacitor containers 22, a first cover layer 25 (e.g., an HDP oxide layer) may be deposited on the top surface 20a of the etched first structural layer 20 as previously described, followed by deposition of a second structural layer 26. The second structural layer 26 may be deposited on the top surface 25a of the first cover layer 25 by any of various methods known in the art including, without limitation, CVD, PVD and the like. It is noted that while FIGS. 6A–6G are not shown to scale, the width of the contact aperture portion 30a, the widths of the capacitor container portions 22a and the thickness of the first cover layer 25 may closely approximate one another, as previously discussed.

Figure 6A:
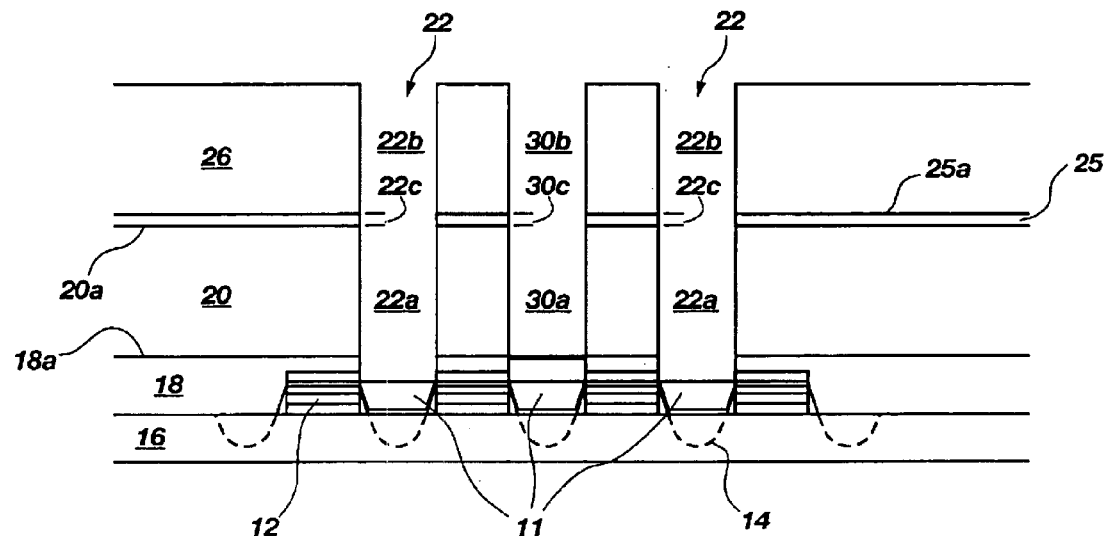
FIGS. 6A–6G schematically illustrate another exemplary method for the formation of a semiconductor device structure having a contact aperture and a plurality of capacitor containers therein with increased aspect ratios.

Next, a photoresist layer (not shown) may be deposited on the top surface 26a of the second structural layer 26 and patterned to form a photomask (not shown). The second structural layer 26 may then be etched (e.g., by conventional etching techniques) to form portions 22b, 30b of respective capacitor containers 22 and contact apertures 30 therein. First cover layer 25 may also be etched using the same etchant, different etchants, or a combination of etchants, as previously described, to form portions 22c and 30c of capacitor containers 22 and contact apertures 30, respectively. As a photoresist (not shown) is used and patterned to form a photomask (not shown) that has an image substantially identical to that utilized to pattern the first structural layer 20, etching of the second structural layer 26 and the first cover layer 25 provides access to the capacitor container portions 22a and the contact aperture portions 30a defined by the first structural layer 20. The result is a semiconductor device structure having both a contact aperture 30 and capacitor containers 22 with increased aspect ratios, as shown in FIG. 6A.

Figure 6B:
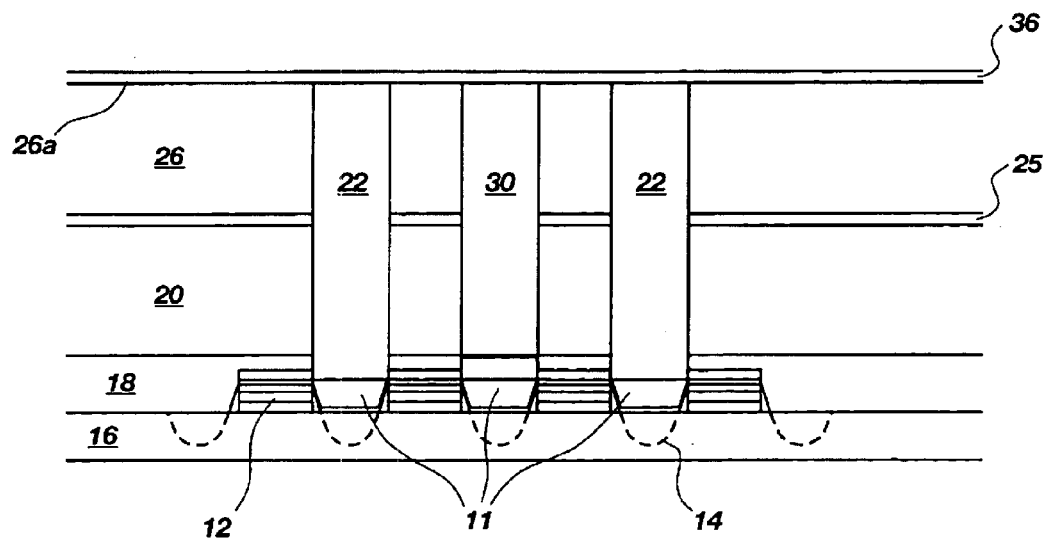

Subsequently, as shown in FIG. 6B, a second cover layer 36 may be deposited atop the surface 26a of the second structural layer 26 using methods previously described. The second cover layer 36 may be formed of materials and by process conditions such that it has a low conformity and low step coverage similar to the first cover layer 25. Again, it will be understood that while FIGS. 6B–6G are not shown to scale, the thickness of the second cover layer 36 may closely approximate the widths of the contact aperture 30 and the capacitor containers 22, as previously discussed.

Figure 6C:
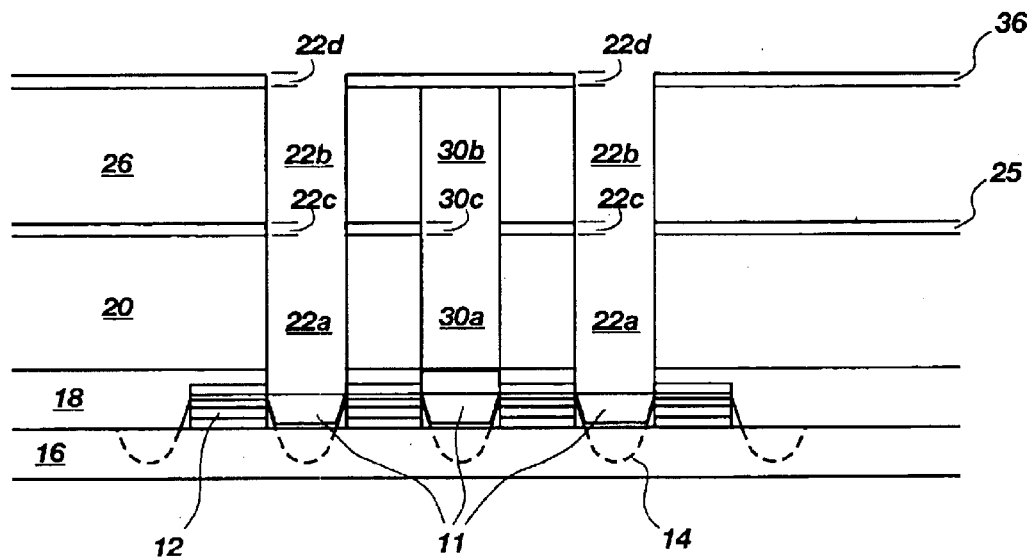

Subsequent to deposition of the second cover layer 36, the second cover layer 36 may be patterned to provide access to the capacitor container portions 22a. A photoresist (not shown) may be used in this instance to form a photomask (not shown) which, along with a suitable etchant, provides the container portions 22d in the second cover layer 36 at locations substantially vertical to the capacitor container portions 22b while leaving the contact aperture portion 30b substantially shielded. Thus, patterning of the second cover layer 36 provides access to the capacitor container portions 22a, 22b but not to the contact aperture portions 30a, 30b. This step is shown in FIG. 6C.

Figure 6D:
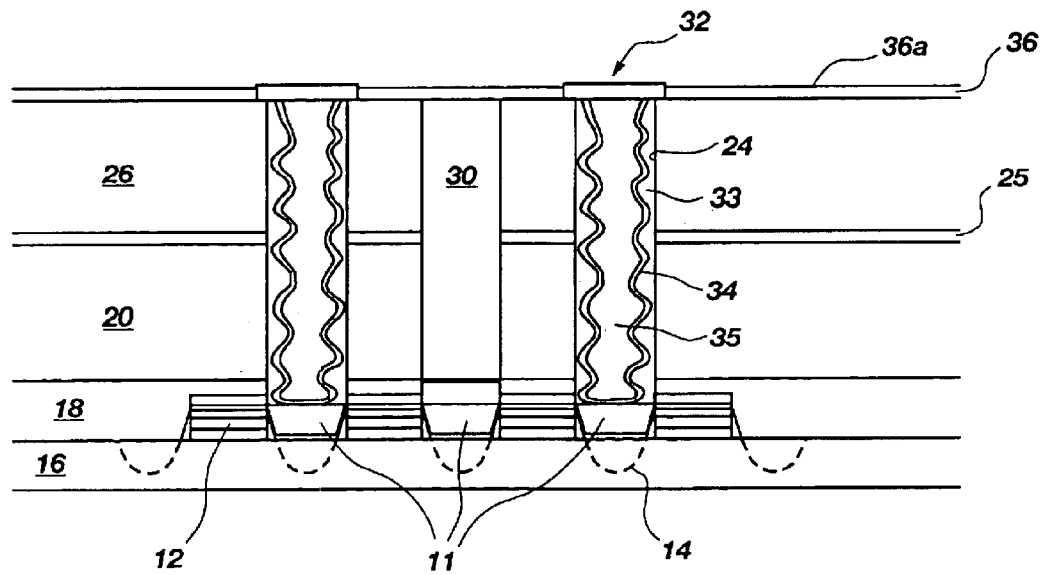
Figure 6E:
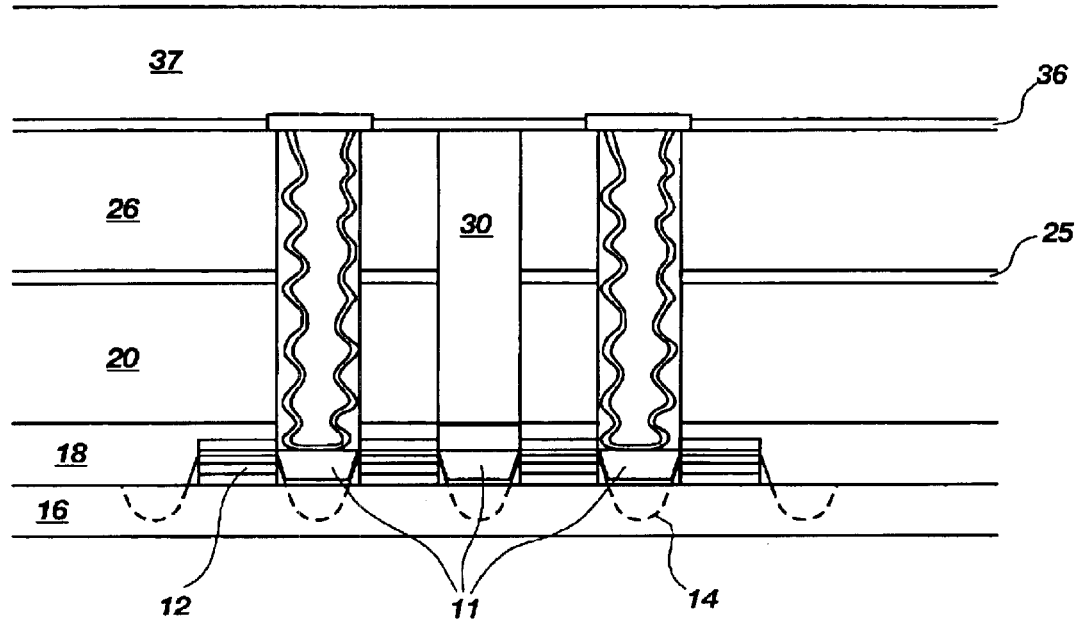

Next, as shown in FIG. 6D, capacitors 32 may be formed in each of the capacitor containers 22 by depositing a layer 33 of any suitable conductive material (e.g., a conductively doped hemispherical grain (HSG) polysilicon layer) on the interior sidewalls 24 of the capacitor containers 22, followed by deposition of a dielectric layer 34 and another conductive layer 35, as known in the art. Subsequently, a third structural layer 37 may be deposited on the top surface 36a of the etched second cover layer 36 using any of various methods known in the art including, without limitation, CVD, PVD and the like. This step is illustrated in FIG. 6E.

Figure 6F:
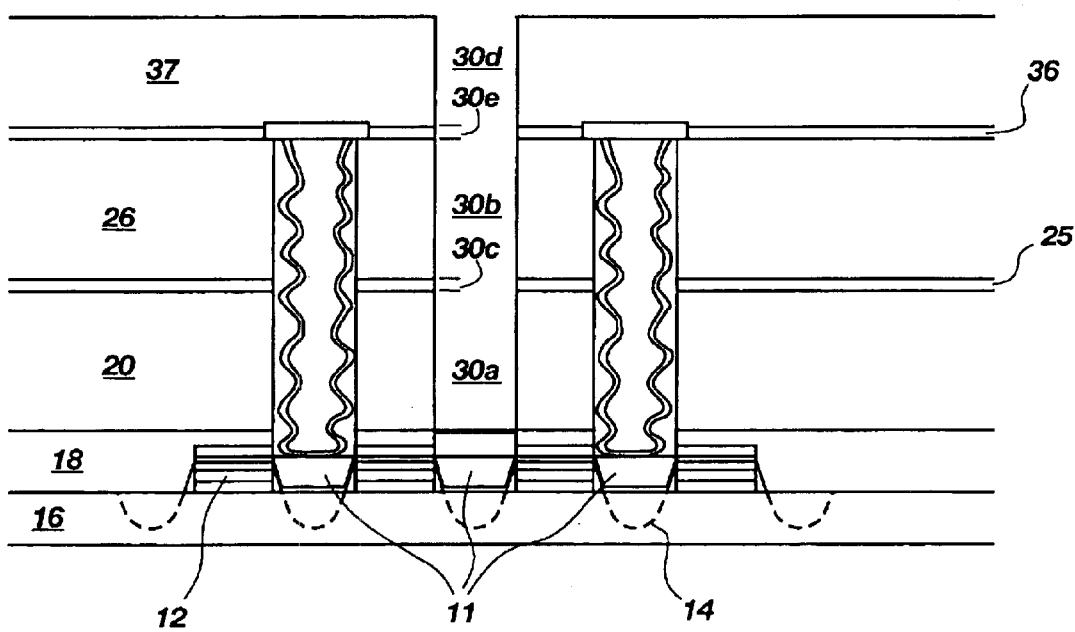

Subsequently, the third structural layer 37 may be etched to form contact aperture portion 30d therein. Though a separate photomask may not be used, second cover layer 36 may also be etched using the same etchant, different etchants, or a combination of etchants, as previously described. In this instance, a photoresist (not shown) may be used and patterned to form a photomask (not shown) which provides an opening, which comprises a portion 30d of the contact aperture 30 in the third structural layer 37 and a portion 30e of the contact aperture 30 in second cover layer 36 at a location substantially vertical to contact aperture portions 30a and 30b. Thus, patterning of the third cover layer 37 and the second cover layer 36 provides access to the contact aperture portions 30a, 30b, and 30c. This step is shown in FIG. 6F.

Figure 6G:
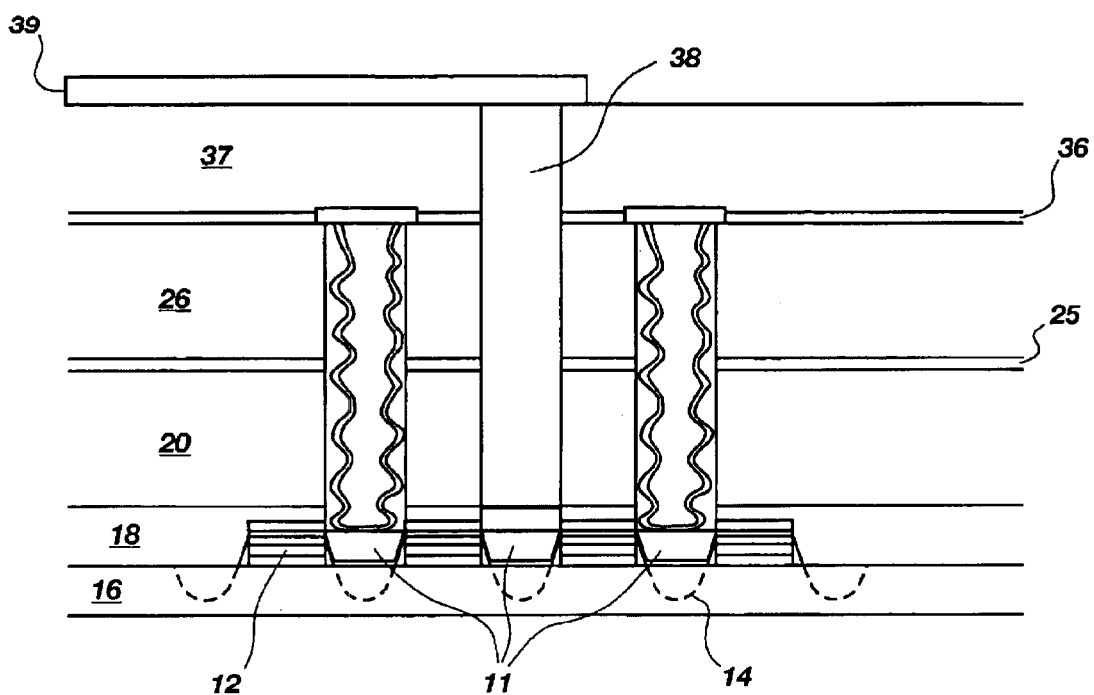

Finally, as shown in FIG. 6G, a conductive metal, such as tungsten, may be deposited into contact aperture 30 to form a conductive plug 38 and a conventional metal 39 may be deposited atop a portion of the third structural layer 37 to electrically connect the conductive plug 38 and from which digit lines (not shown) are subsequently formed. Such processes are known to those of ordinary skill in the art and will not be further discussed herein.

In an alternative embodiment, the conductive metal, e.g., tungsten, may be deposited in the contact aperture 30 in stepwise fashion as the various portions 30a, 30b, 30c, 30d, 30e of the contact aperture 30 are formed. This method may be employed where the subsequent processes for fabricating the capacitors 32 will affect the stability of the contact apertures 30 as they exist in the system.

Figure 7A:
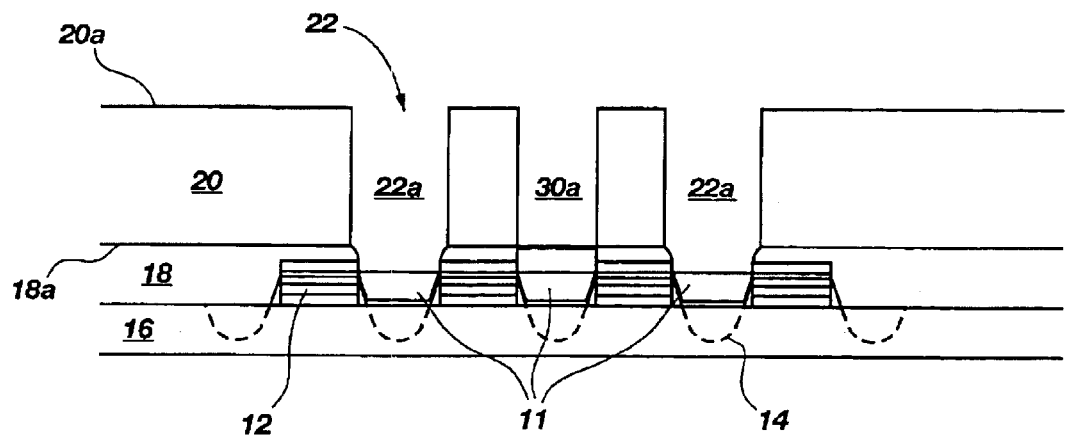
FIGS. 7A–7H schematically illustrate yet another exemplary method for forming a semiconductor device structure having both a contact aperture and a plurality of capacitor containers therein with increased height-to-width ratios.

In yet another method of forming semiconductor device structures 10 having both contact apertures 30 and capacitor containers 22, a first structural layer 20 (e.g., a BPSG layer) may be deposited on the top surface 18a of an insulating layer 18 that surrounds the active device regions 14 of a semiconductor substrate 16, as previously described. Subsequently, a photoresist layer (not shown) may be deposited on the top surface 20a of the first structural layer 20 and patterned to form a photomask (not shown). The first structural layer 20 then may be etched to form a lowermost portion 30a of at least one contact aperture 30 therein, as well as the lowermost portions 22a of capacitor containers 22 on either side of contact aperture portion 30a. Both the contact aperture portion 30a and the capacitor container portions 22a may be etched at locations in the first structural layer 20 such that each substantially aligns with a conductive plug 11 or an active device region 14 of the semiconductor substrate 16, as desired, and provides access thereto. This is illustrated in FIG. 7A. It will be understood that a portion of the insulating layer 18 also may be patterned such that the contact aperture portion 30a and capacitor container portions 22a may be exposed to the conductive plug 11 (or active device region 14, if desired). Further, it is again noted that fabrication of semiconductor device structures having such features is typically carried out with respect to multiple contact apertures 30 and multiple capacitor containers 22 substantially simultaneously. However, for the sake of clarity, only one such contact aperture portion 30a and its relation to capacitor container portions 22a on either side of the contact aperture portion 30a are depicted in FIGS. 7A–7H.

Figure 7B:
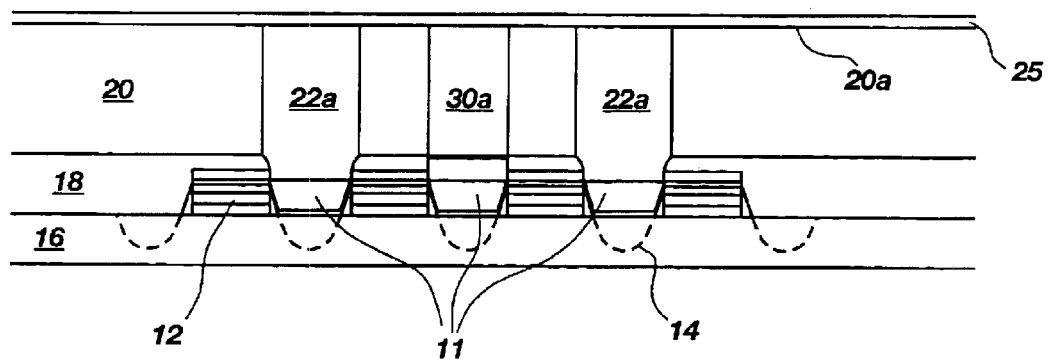

As illustrated in FIG. 7B, subsequent to forming the contact aperture portion 30a and the capacitor container portions 22a, a first cover layer 25 (for example, an HDP oxide layer) may be deposited on the top surface 20a of the etched first structural layer 20, as previously described. It is noted that while FIGS. 7A–7H are not shown to scale, the width of contact aperture portion 30a, the widths of capacitor container portions 22a and the thickness of first cover layer 25 may closely approximate one another, as previously discussed.

Figure 7C:
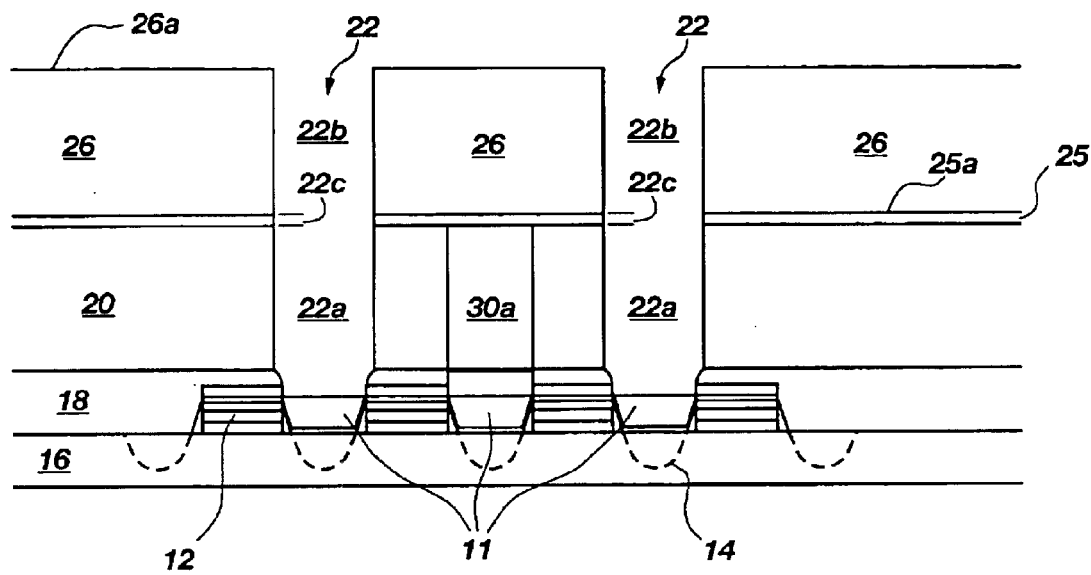

Subsequently, a second structural layer 26 may be deposited on the top surface 25a of the first cover layer 25 by any of various methods known in the art, e.g., CVD. Next, a photoresist layer (not shown) may be deposited on the top surface 26a of the second structural layer 26 and patterned (e.g., by conventional etching techniques) to form a photomask (not shown) through which the capacitor container portions 22b may be etched. The first cover layer 25 may also be etched using the same etchant, different etchants, or a combination of etchants, as previously described, to form container portions 22c. In this instance, a photoresist (not shown) may be used and patterned to form a photomask (not shown) that provides capacitor container portions 22b oriented substantially vertical to capacitor container portions 22a defined by the first structural layer 20. Thus, etching of the second structural layer 26 and the first cover layer 25 provides access to the lowermost portions 22a of the capacitor containers 22. The result is capacitor containers 22 having increased aspect ratios. This is illustrated in FIG. 7C.

Figure 7D:
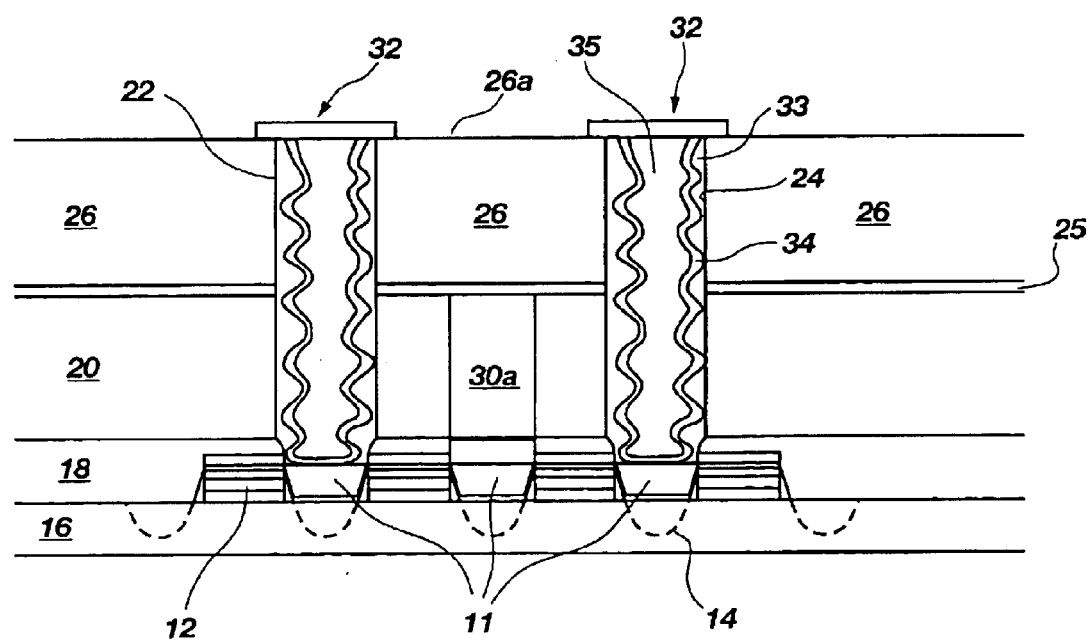
Figure 7E:
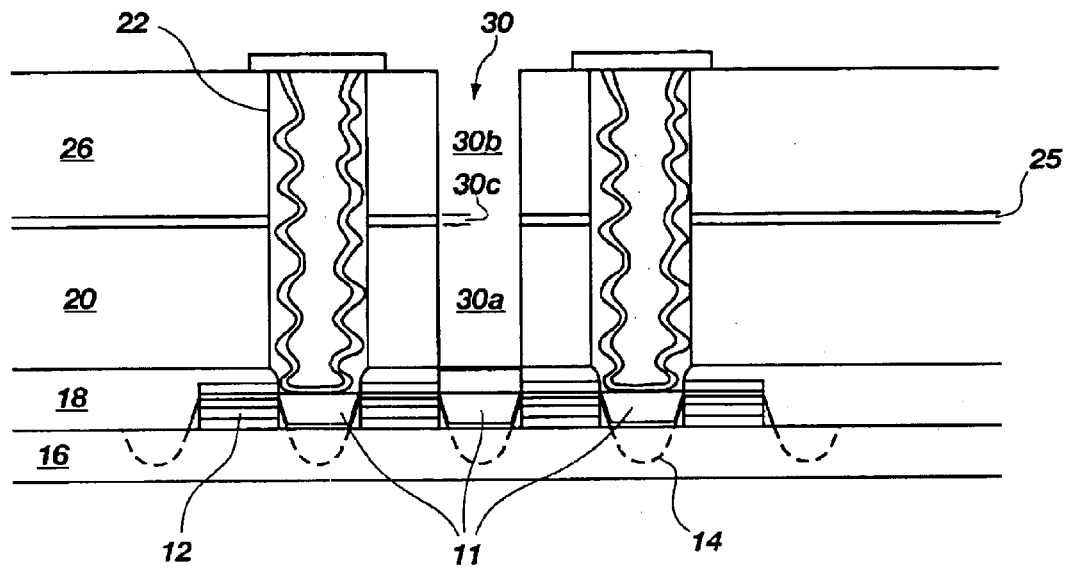

Subsequently, as shown in FIG. 7D, capacitors 32 may be formed in each of the capacitor containers 22 by depositing a layer 33 of any suitable conductive material (e.g., a conductively doped hemispherical grain (HSG) polysilicon layer) on the interior sidewalls 24 of each capacitor container 22, followed by deposition of a dielectric layer 34 and another conductive layer 35, as known in the art. Subsequently, a different photoresist may be applied to the top surface 26a of second structural layer 26 and patterned with an image that provides an opening in the second structural layer 26 that comprises an upper portion 30b of the contact aperture 30 and provides access to the lowermost portion 30a of the contact aperture 30. It will be understood that first cover layer 25 may also be patterned to form contact aperture portion 30c for access to contact aperture 30 to be effected. This may be accomplished by using the same etchant, different etchants, or a combination of etchants, as previously discussed. The result is a contact aperture 30 having an increased aspect ratio as shown in FIG. 7E.

Figure 7F:
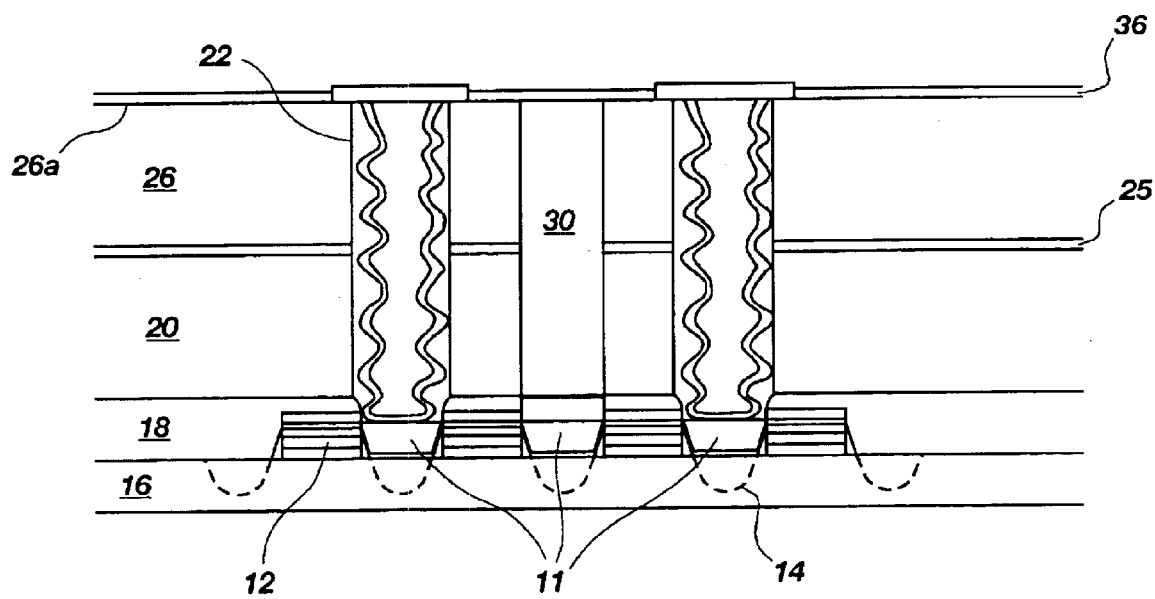
Figure 7G:
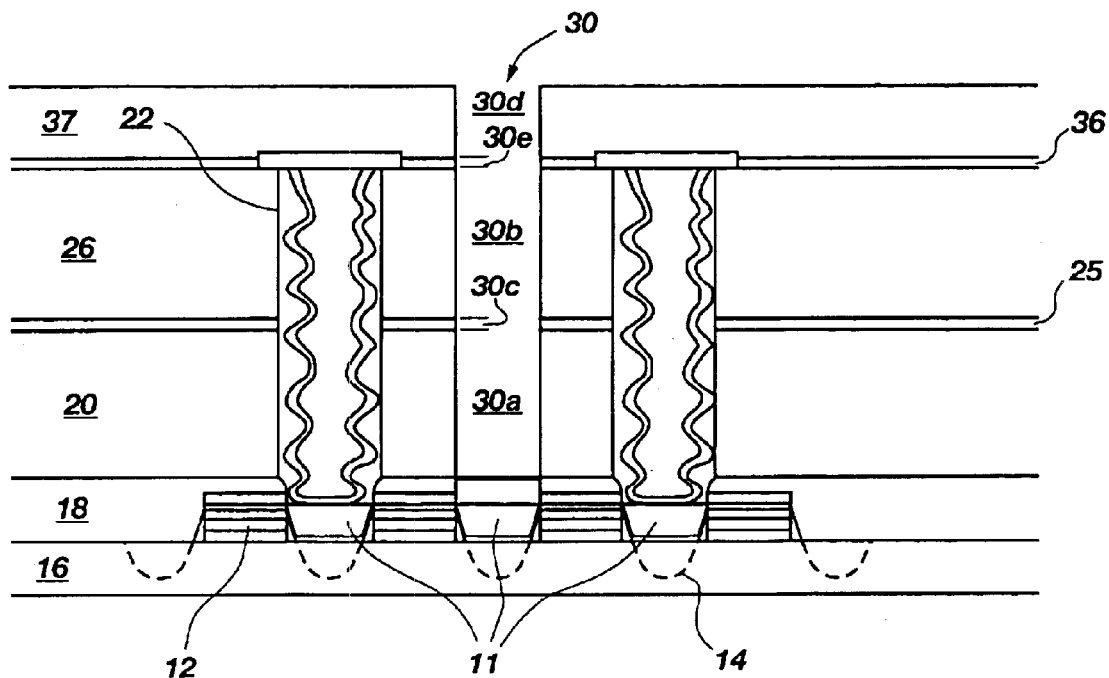

Next, as shown in FIG. 7F, a second cover layer 36 may be deposited on the top surface 26a of second structural layer 26. The second cover layer 36 may be formed of materials and by process conditions such that it has a low conformity and low step coverage, similar to that of first cover layer 25. Again, it will be understood that while FIGS. 7F–7H are not shown to scale, the thickness of the second cover layer 36 may closely approximate the widths of the contact aperture 30 and the capacitor containers 22, as previously discussed.

Subsequently, a third structural layer 37 may be deposited atop the second cover layer 36, for instance, by CVD, PVD, or the like. A photoresist (not shown) may be used and patterned to form a photomask (not shown) through which an opening may be formed in the third structural layer 37, which opening comprises another upper portion 30d of the contact aperture 30. The second cover layer 36 may also be etched using the same etchant, different etchants, or a combination of etchants, as previously described, to form portion 30e of contact aperture 30. In this instance, a photoresist (not shown) may be utilized and patterned to form a photomask (not shown) that has an image substantially identical to that used to form the contact aperture portion 30b in the second structural layer 26 and the contact aperture portion 30c in the first cover layer 25. Thus, patterning of the third structural layer 37 and the second cover layer 36 provides access to the lower portions 30a, 30b, 30c of the contact aperture 30. This step is illustrated in FIG. 7G. The result is a contact aperture 30 having an even further increased aspect ratio.

Figure 7H:
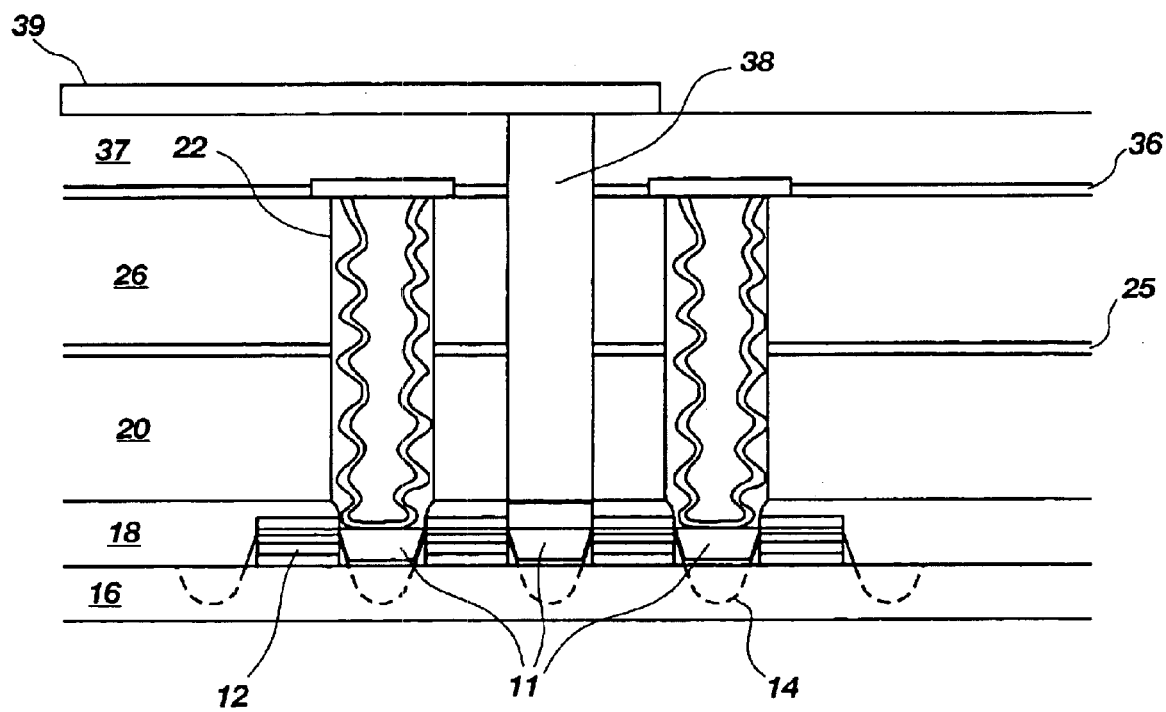

Subsequently, as shown in FIG. 7H, a conductive metal, such as tungsten, may be deposited at least into contact aperture 30 to form a conductive plug 38 therein. The conductive metal may also be patterned to form digit lines (not shown) or another metal 39 may be deposited atop at least a portion of third structural layer 37 and patterned to form digit lines. Such processes are known to those of ordinary skill in the art and will not be discussed further herein.

In an alternative embodiment, the conductive metal, e.g., tungsten, may be deposited in the contact aperture 30 in stepwise fashion as the various portions 30a, 30b, 30c, 30d, 30e of the contact aperture 30 are formed. This method may be employed where the subsequent processes for fabricating the capacitor 32 will affect the stability of the contact apertures 30.

One potential difficulty in manufacturing contact apertures 30, capacitor containers 22 and other semiconductor device structures having openings etched therein with increased aspect ratios according to the methods of the present invention is the alignment of the capacitor containers 22, the contact apertures 30, or other openings formed in the second (or third, etc.) structural layer 26 to those formed in the first (or second, etc.) structural layer 20. In order to minimize offset of the alignment in the photolithography and etching procedures, the methods of the present invention may be self-aligning, which may ensure communication between the upper portions of the capacitor containers 22 and/or the upper portions of the contact apertures 30 and the lower portions of the capacitor containers 22 and/or contact apertures 30.

Self-aligned interconnection in accordance with teachings of the present invention may be effected by use of selective etch processes, for example, the use of etchants or etchant mixtures which remove silicon oxide over silicon nitride. For this reason, a suitable material from which a self-aligned interconnection structure may be formed for a structural layer comprised of BPSG is silicon nitride because the necessary selective etch processes already exist in the semiconductor industry and are widely used. These processes are more fully described below. As will be understood and appreciated by those of ordinary skill in the art, other materials may be used to facilitate self-aligned interconnection in accordance with the teachings of the present invention, depending upon the materials from which the structural layers themselves are formed.

Figure 8A:
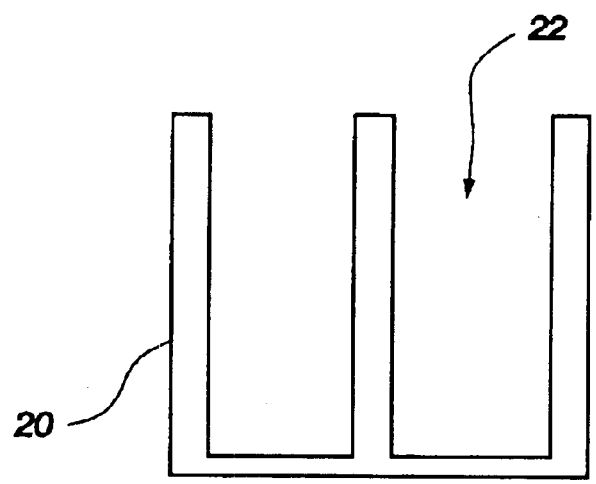
FIGS. 8A and 8B schematically illustrate a self-aligned interconnection structure and method of forming the same according to the teachings of the present invention.
Figure 8B:
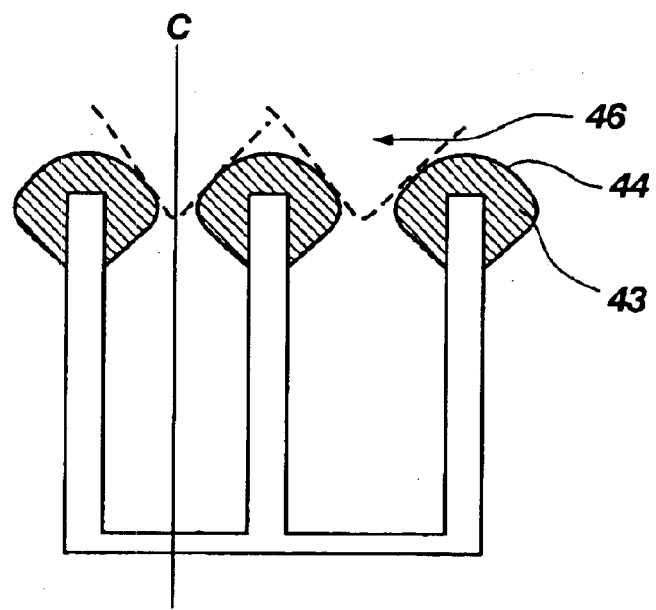

The process of forming a self-aligning interconnection structure in accordance with teachings of the present invention is described and illustrated in FIGS. 8A and 8B. Initially, a first structural layer 20 (FIGS. 3A–3D and 5A–7H) having one or more capacitor containers 22 and/or contact apertures 30 therein is formed, as previously described. An exemplary structure having a structural layer 20 with a plurality of capacitor containers 22 etched therein is shown in FIG. 8A. It will be understood by those of ordinary skill in the art that the semiconductor device structures schematically illustrated herein may be of any conventional design, having all of the components and materials so associated.

Subsequently, as shown in FIG. 8B, a layer 43 comprising a material (e.g., silicon nitride) that is removed at a slower rate than a material (e.g., silicon dioxide) of a next higher layer (not shown) is deposited on top of the structural layer 20 so as to partially, but not fully, cover the openings (e.g., capacitor containers 22) therein. An opening through layer 43 is located substantially vertically above each opening in the structural layer 20 and has a dimension small enough to substantially prevent material of a subsequently deposited, next-higher structural layer (not shown) from being introduced into the openings. Thus, cap-shaped nitride structures, referred to herein as nitride caps 44, serve the functions of the first cover layer 25 or interlayer, as previously described. As such, utilizing the present method alleviates the need to provide a separate cover layer atop a lower etched structural layer.

Layer 43 may be deposited by any of various methods known in the art, including, without limitation, known PECVD nitride processes. Based upon the geometric limitations of structural layer 20 having one or more openings (e.g., capacitor containers 22) therein, process conditions may be controlled to produce a layer 43 so as to include nitride caps 44, which reside on top of remaining portions of the structural layer 20. Nitride caps 44 residing on opposite sides of an opening (e.g., capacitor container 22) of a structural layer 20 form a sort of funnel structure 46, the apex of which points toward the center (represented in FIG. 8B as line C) of the openings etched in the structural layer 20. This funnel structure 46 is shown by dashed line in FIG. 8B. As the funnel structure 46 is formed in situ and determined by the position of the opening (e.g., capacitor container 22 or contact aperture 30, as appropriate), the apex of the funnel structure 46 self-aligns toward the center of the opening. The funnel structure 46 will then facilitate alignment of openings formed in the next-higher structural layer (not shown) with those of the structural layer 20, the next-higher structural layer being deposited on top of the nitride caps 44 using any of the methods previously described.

To achieve a structure having openings (e.g., capacitor containers 22, contact apertures 30, or other openings) with increased aspect ratios, an etching process selective to the nitride cap 44 may be used. In a first step, the next-higher structural layer (not shown) may be etched with an etchant selective for the oxide material (e.g., BPSG) of the structural layer itself. This etchant will selectively stop at the nitride cap 44. Subsequently, in a second step, the nitride cap 44 may be etched with a different etchant (or combination of etchants) that is selective for the nitride cap 44 without over-etching of the structural layer.

Figure 9:
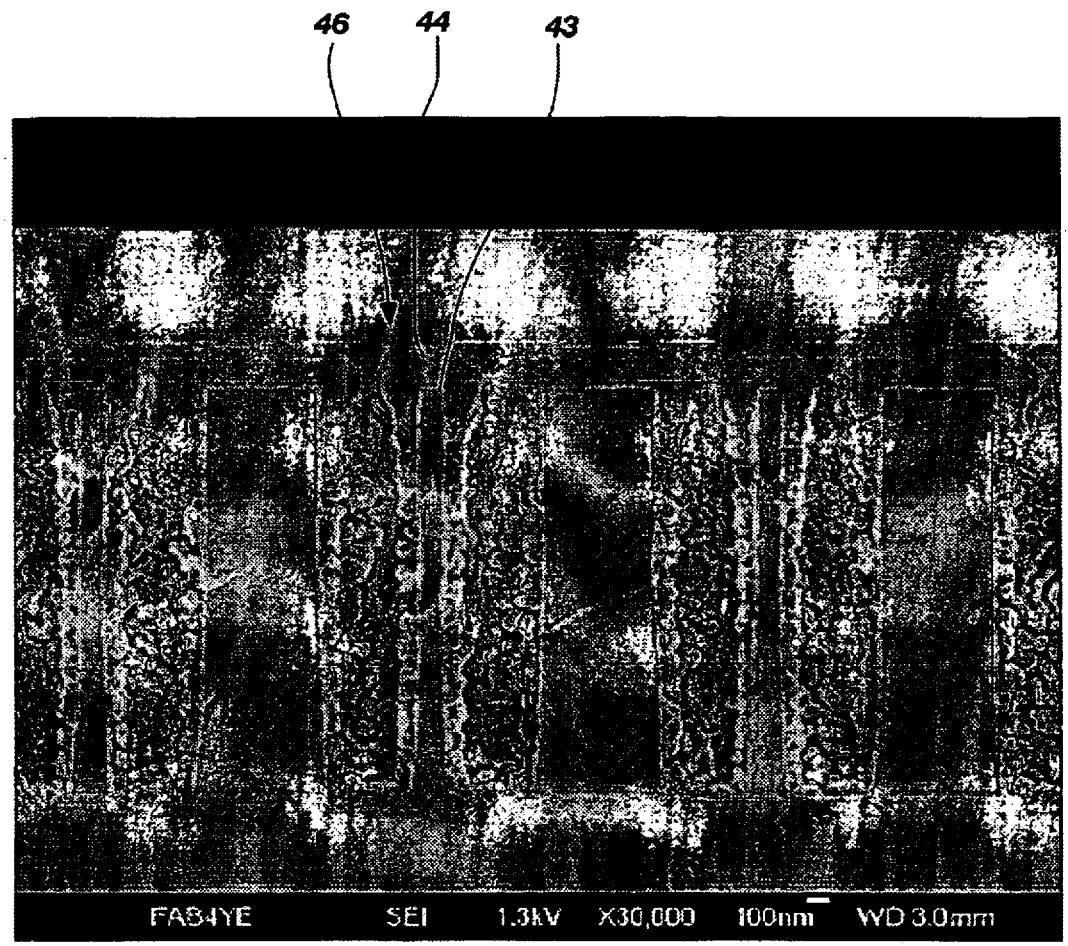
FIG. 9 is an electron micrograph of a semiconductor device structure taken in cross section that illustrates the nitride "cap" and "funnel" structures of a self-aligned interconnection structure according to the teachings of the present invention.
Figure 10:
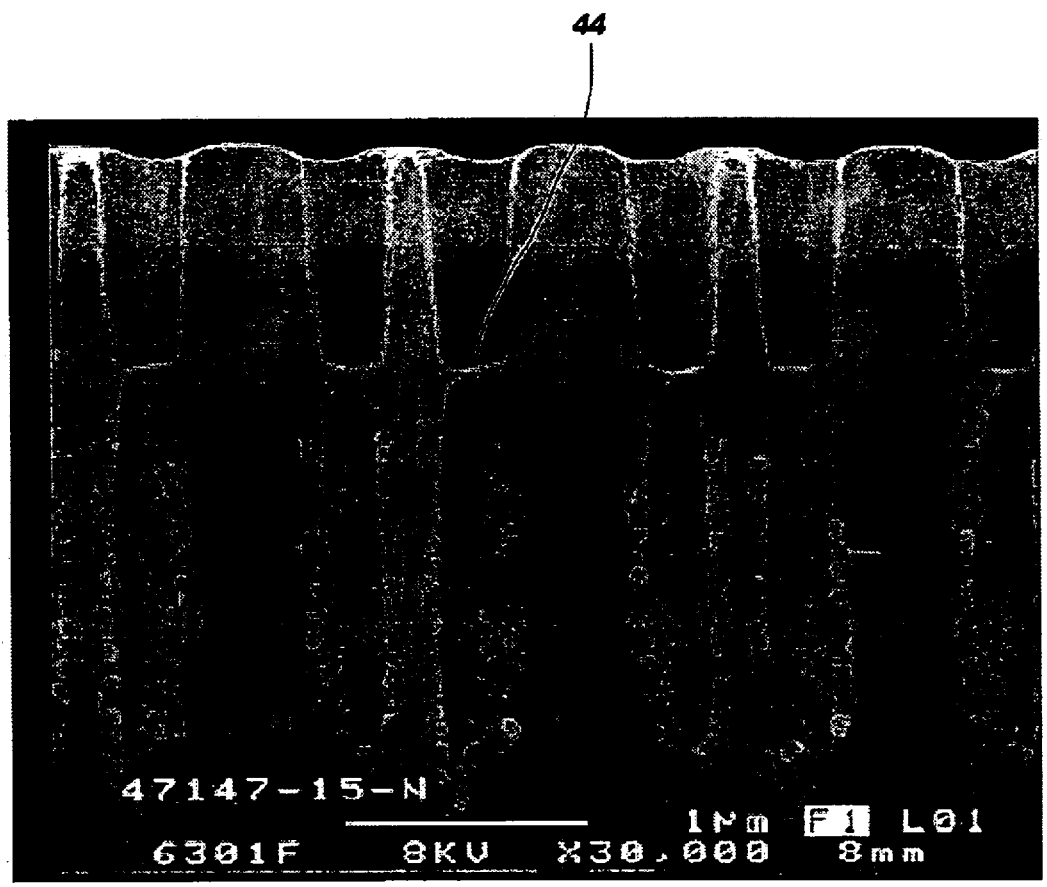
FIG. 10 is an electron micrograph of a semiconductor device structure taken in cross section that illustrates the alignment of capacitor containers formed in stacked structural layers in accordance with the teachings of the present invention.

The electron micrograph cross-sectional image shown in FIG. 9 illustrates the nitride cap 44 and funnel structures 46 on a semiconductor substrate 16. The image clearly shows the concept described in FIG. 8B. Further, as shown in FIG. 10, when a second etch is performed to form the next-higher layer of openings (e.g., capacitor containers 22 or contact apertures 30, as appropriate), the etchant stops at the nitride cap 44. Although the etch process was not completed in the micrograph of FIG. 10, it can be clearly seen that the top and bottom container portions 22b, 22a are in substantial alignment. With another etchant (or combination of etchants) to etch the nitride cap 44, the upper capacitor container portions 22b (and/or contact aperture portions 30b) and the bottom container portions 22a (and/or contact aperture portions 30a) will become connected to form capacitor containers 22 (and/or contact apertures 30) having an increased aspect ratio.

Carried out as previously described, the teachings of the present invention offer a number of advantages over conventional technology. First, decreasing die sizes and the limitations of current etch technology will no longer limit the widths of capacitor containers, contact apertures, or other openings in semiconductor substrates. Accordingly, adequate capacitance may still be achieved despite a reduction in the widths of such openings. Second, the methods described herein are scalable. Stated another way, the smaller the openings (e.g., contact apertures, capacitor containers, or other openings), the more advantages the teachings of the present invention provide. Further, the method for self-alignment provides a large margin for the photolithography and etching processes to align two or more structural layers to create capacitor containers, contact apertures, or other openings in a semiconductor substrate having increased height-to-width ratios.

In conclusion, the present invention is directed to fabrication of semiconductor devices having capacitor containers, contact apertures, or other recessed features with increased height-to-width ratios. Further, the present invention relates to methods of forming semiconductor device structures having capacitor containers, contact apertures, or other recessed features with increased aspect ratios. Still further, the present invention is directed to methods of aligning multilayered semiconductor device structures to create a structure having dimensions as close to the design requirements as possible.

The present invention has been described in relation to particular embodiments that are intended in all respects to be illustrative rather than restrictive. Alternative embodiments will become apparent to those skilled in the art to which the present invention pertains without departing from its scope.

What is claimed is:

1. A method of forming a semiconductor structure, comprising:
   providing a first structural layer on an active surface of a semiconductor substrate, wherein the first structural layer comprises at least one of phosphosilicate glass, borosilicate glass, and borophosphosilicate glass;
   forming a first opening portion in the first structural layer;
   depositing a second structural layer over and in contact with at least a portion of the first structural layer having the first opening portion therein; and
   forming a second opening portion in the second structural layer which is in substantial vertical alignment with the first opening portion to form a contiguous opening in the semiconductor structure.

2. The method of claim 1, wherein providing the first structural layer on the active surface of the semiconductor substrate comprises providing the first structural layer in contact with at least one of an active device region and a conductive plug formed on the semiconductor substrate.

3. The method of claim 1, wherein forming the first opening portion in the first structural layer comprises forming the first opening portion using at least one of glow-discharge sputtering, ion milling, reactive ion etching, reactive ion beam etching, plasma etching, high-density plasma etching, point plasma etching, magnetic ion etching, magnetically enhanced reactive ion etching, plasma enhanced reactive ion etching, and electron cyclotron resonance.

4. The method of claim 1, wherein depositing the second structural layer over and in contact with the at least a portion of the first structural layer having the first opening portion therein comprises depositing the second structural layer using at least one of chemical vapor deposition, spin-on-glass, physical vapor deposition, and sputtering.

5. The method of claim 1, wherein depositing the second structural layer over and in contact with the at least a portion of the first structural layer having the first opening portion therein comprises depositing at least one of a phosphosilicate glass structural layer, a borosilicate glass structural layer, and a borophosphosilicate glass structural layer.

6. The method of claim 1, wherein forming the second opening portion in the second structural layer comprises forming the second opening portion using at least one of glow-discharge sputtering, ion milling, reactive ion etching, reactive ion beam etching, plasma etching, high-density plasma etching, point plasma etching, magnetic ion etching, magnetically enhanced reactive ion etching, plasma enhanced reactive ion etching, and electron cyclotron resonance.

7. The method of claim 1, wherein forming a second opening portion in the second structural layer comprises forming the second opening portion in the second structural layer after forming the first opening portion in the first structural layer.

8. The method of claim 1, wherein depositing a second structural layer over and in contact with at least a portion of the first structural layer having the first opening portion therein comprises depositing the second structural layer while the first opening portion in the first structural layer remains unfilled.

9. The method of claim 1, wherein forming a second opening portion in the second structural layer which is in substantial vertical alignment with the first opening portion to form a contiguous opening in the semiconductor structure comprises forming at least one of a capacitor container and a contact aperture.

10. The method of claim 1, further comprising:
depositing a first conductive material in the contiguous opening in the semiconductor structure;
depositing a dielectric layer on the first conductive material; and
depositing a second conductive material on the dielectric layer.

11. The method of claim 1, further comprising:
depositing a conductive material in the contiguous opening in the semiconductor structure.

12. A method for forming a structure for a semiconductor device, comprising:
forming a first opening portion in a first structural layer, wherein the first structural layer comprises at least one of phosphosilicate glass, borosilicate glass, and borophosphosilicate glass;
forming a second opening portion in a second structural layer, the second structural layer positioned over and in contact with at least a portion of the first structural layer having the first opening portion therein; and
positioning the first opening portion and the second opening portion in substantial vertical alignment with one another to form at least one substantially vertical opening in the semiconductor device structure, wherein the at least one substantially vertical opening has a height-to-width ratio exceeding 7:1.

13. The method of claim 12, wherein forming the first opening portion in the first structural layer comprises forming the first opening portion using at least one of glow-discharge sputtering, ion milling, reactive ion etching, reactive ion beam etching, plasma etching, high-density plasma etching, point plasma etching, magnetic ion etching, magnetically enhanced reactive ion etching, plasma enhanced reactive ion etching, and electron cyclotron resonance.

14. The method of claim 12, wherein forming the second opening portion in the second structural layer comprises forming the second opening portion using at least one of glow-discharge sputtering, ion milling, reactive ion etching, reactive ion beam etching, plasma etching, high-density plasma etching, point plasma etching, magnetic ion etching, magnetically enhanced reactive ion etching, plasma enhanced reactive ion etching, and electron cyclotron resonance.

15. The method of claim 12, wherein forming a second opening portion in a second structural layer comprises forming the second opening portion in the second structural layer after forming the first opening portion in the first structural layer.

16. The method of claim 12, wherein forming a second opening portion in a second structural layer comprises depositing the second structural layer while the first opening portion in the first structural layer remains unfilled.

17. The method of claim 12, wherein positioning the first opening portion and the second opening portion in substantial vertical alignment with one another to form at least one substantially vertical opening in the semiconductor device structure comprises forming at least one of a capacitor container and a contact aperture.

18. The method of claim 12, further comprising:
depositing a first conductive material in the at least one substantially vertical opening in the semiconductor device structure;
depositing a dielectric layer on the first conductive material; and
depositing a second conductive material on the dielectric layer.

19. The method of claim 12, further comprising:
depositing a conductive material in the at least one substantially vertical opening in the semiconductor device structure.

* * * * *